US012775161B2

(12) United States Patent
Haag et al.

(10) Patent No.: US 12,775,161 B2
(45) Date of Patent: Oct. 27, 2026

(54) REFLECTIVE POLARIZER AND DISPLAY SYSTEM

(71) Applicant: 3M INNOVATIVE PROPERTIES COMPANY, St. Paul, MN (US)

(72) Inventors: Adam D. Haag, Woodbury, MN (US); Martin E. Denker, Vadnais Heights, MN (US); Timothy J. Nevitt, Red Wing, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 939 days.

(21) Appl. No.: 17/797,042

(22) PCT Filed: Feb. 1, 2021

(86) PCT No.: PCT/IB2021/050788

§ 371 (c)(1),
(2) Date: Aug. 2, 2022

(87) PCT Pub. No.: WO2021/156728

PCT Pub. Date: Aug. 12, 2021

(65) Prior Publication Data

US 2023/0074182 A1 Mar. 9, 2023

Related U.S. Application Data

(60) Provisional application No. 62/971,476, filed on Feb. 7, 2020.

(51) Int. Cl.
*H10K 59/35* (2023.01)
*G02B 5/30* (2006.01)
(Continued)

(52) U.S. Cl.
CPC ......... *G02B 27/0018* (2013.01); *G02B 5/305* (2013.01); *G02B 5/3066* (2013.01);
(Continued)

(58) Field of Classification Search
CPC .. G02B 27/0018; G02B 5/305; G02B 5/3066; G02B 5/3083; H10K 50/86; H10K 59/35
See application file for complete search history.

(56) References Cited

U.S. PATENT DOCUMENTS 5,882,774 A 3/1999 Jonza et al.
6,179,948 B1 1/2001 Merrill et al.
(Continued)

FOREIGN PATENT DOCUMENTS

CN 102103311 A 6/2011
CN 107407755 A 11/2017
(Continued)

OTHER PUBLICATIONS

Denker, "Advanced Polarizer Film for Improved Performance of Liquid Crystal Displays," Society for Information Displays (SID) International Conference, SID International Symposium Digest of Technical Papers, 2006, vol. 37, No. 01, pp. 1528-1530.
(Continued)

*Primary Examiner* — Jeff W Natalini
*Assistant Examiner* — Ian Isaac Degrasse
(74) *Attorney, Agent, or Firm* — Theresa Stadheim

(57) ABSTRACT

A reflective polarizer is such that for substantially normally incident light and for blue, green and red wavelengths, the reflective polarizer: has a transmission spectrum including a blue transmission stop band for the incident light polarized along a first direction; reflects at least about 50% of the incident light polarized along the first direction for the blue wavelength; transmits at least about 50% of the incident light polarized along an orthogonal second direction for each of the blue, green and red wavelengths; and transmits between about 50% and about 95% of the incident light polarized along the first direction for each of the green and red wavelengths. The blue transmission stop band has
(Continued)

opposing first and second band edges having respective first and second slope magnitudes S1 and S2, where S1/S2≥2. A display system includes the reflective polarizer disposed on a display panel.

7 Claims, 16 Drawing Sheets

(51) Int. Cl.
*G02B 27/00* (2006.01)
*H10K 50/86* (2023.01)

(52) U.S. Cl.
CPC ............. *H10K 50/86* (2023.02); *H10K 59/35* (2023.02); *G02B 5/3083* (2013.01)

(56) References Cited

U.S. PATENT DOCUMENTS

| | | | | |
|---|---|---|---|---|
| 6,300,991 | B1 | 10/2001 | Schadt et al. | |
| 6,783,349 | B2 | 8/2004 | Neavin et al. | |
| 6,967,778 | B1 | 11/2005 | Wheatley et al. | |
| 9,162,406 | B2 | 10/2015 | Neavin et al. | |
| 9,773,847 | B2 | 9/2017 | Epstein et al. | |
| 2002/0180916 | A1 | 12/2002 | Schadt et al. | |
| 2003/0028048 | A1 | 2/2003 | Cherkaoui et al. | |
| 2005/0072959 | A1 | 4/2005 | Moia et al. | |
| 2006/0197068 | A1 | 9/2006 | Schadt et al. | |
| 2007/0247573 | A1 | 10/2007 | Ouderkirk | |
| 2009/0079909 | A1 * | 3/2009 | Ouderkirk | G02F 1/133536 349/67 |
| 2015/0109561 | A1 * | 4/2015 | Fuchida | G02B 5/3083 349/96 |
| 2016/0124226 | A1 * | 5/2016 | Ide | G02B 27/142 359/583 |
| 2016/0195659 | A1 * | 7/2016 | Johnson | G02B 5/3041 359/489.11 |
| 2017/0371083 | A1 * | 12/2017 | Johnson | G02B 5/3041 |

FOREIGN PATENT DOCUMENTS

| | | | |
|---|---|---|---|
| DE | 102005009781 | A1 | 9/2006 |
| KR | 20060056244 | A | 5/2006 |
| WO | 2012099794 | A2 | 7/2012 |
| WO | 2016148141 | A1 | 9/2016 |
| WO | 2019069214 | A2 | 4/2019 |
| WO | 2019204078 | A1 | 10/2019 |
| WO | 2020051874 | A1 | 3/2020 |
| WO | 2021059191 | A1 | 4/2021 |

OTHER PUBLICATIONS

International Search Report for PCT International Application No. PCT/IB2021/050788, mailed on Apr. 13, 2021, 4 pages.

* cited by examiner

REFLECTIVE POLARIZER AND DISPLAY SYSTEM

CROSS REFERENCE TO RELATED APPLICATIONS

This application is a national stage filing under 35 U.S.C. 371 of PCT/IB2021/050788, filed Feb. 1, 2021, which claims the benefit of Provisional Application No. 62/971,476, filed Feb. 7, 2020, the disclosures of which are incorporated by reference in their entirety herein.

BACKGROUND

Organic light emitting diode (OLED) displays typically include a circular polarizer to reduce reflection of ambient light from the display.

SUMMARY

The present description relates to reflective polarizers and display systems. A display system can include a display panel including a plurality light emitting pixels and a reflective polarizer which can be disposed on the light emitting pixels. The reflective polarizer can increase a light output of the display system by recycling light that would otherwise be absorbed by an absorbing polarizer, for example. An optical stack can include the reflective polarizer and at least one of a retarder layer and an absorbing polarizer.

According to some embodiments, it has been found that using a reflective polarizer having a blue transmission stop band provides increased recycling of light from blue pixels without producing substantial undesired ambient reflection and without producing substantial ghosting. The blue pixels of OLED devices are typically less efficient and/or have shorter lifetimes than other emitters. Recycling in the blue can therefore improve overall efficiency and/or display lifetime. In some embodiments, a reflective polarizer has a blue transmission stop band with a right band edge having a gradual slope such that the reflective polarizer provides some reflectance for light having a green and/or a red wavelength. It has been found that, according to some embodiments, a gradual slope in the right band edge of the blue transmission stop band can result in reduced color shift of ambient light reflected from the display and improved brightness gain for white light emitted from the display system. In some embodiments, a reflective polarizer can include a local blue reflection band and local first and second transmission stop bands. According to some embodiments, a reflective polarizer includes a local blue reflection band and includes sequentially arranged first, second and third spectrum portions where the second spectrum portion has a lower average change in transmission per change in wavelength than the first and third spectrum portions. In some embodiments, a reflective polarizer has a higher reflectance in a blue wavelength range than in a green-red wavelength range for a block polarization state. According to some embodiments, a reflective polarizer has a reflection spectrum selected such that a brightness of blue light is increased by at least about 10 percent and such that a substantially white light substantially normally incident on the display has a low color shift (e.g., lower |a*|, |b*| compared to using conventional notch reflective polarizers and/or or compared to using broadband reflective polarizers). According to some embodiments, the reflective polarizer can provide a brightness increase while resulting in lower white point color shift of light reflected from a display system, than from display systems incorporating conventional notch reflective polarizers while providing lower ghosting and/or lower ambient reflection than display systems using broadband reflective polarizers.

These and other aspects will be apparent from the following detailed description. In no event, however, should this brief summary be construed to limit the claimable subject matter.

DETAILED DESCRIPTION

Figure 1:
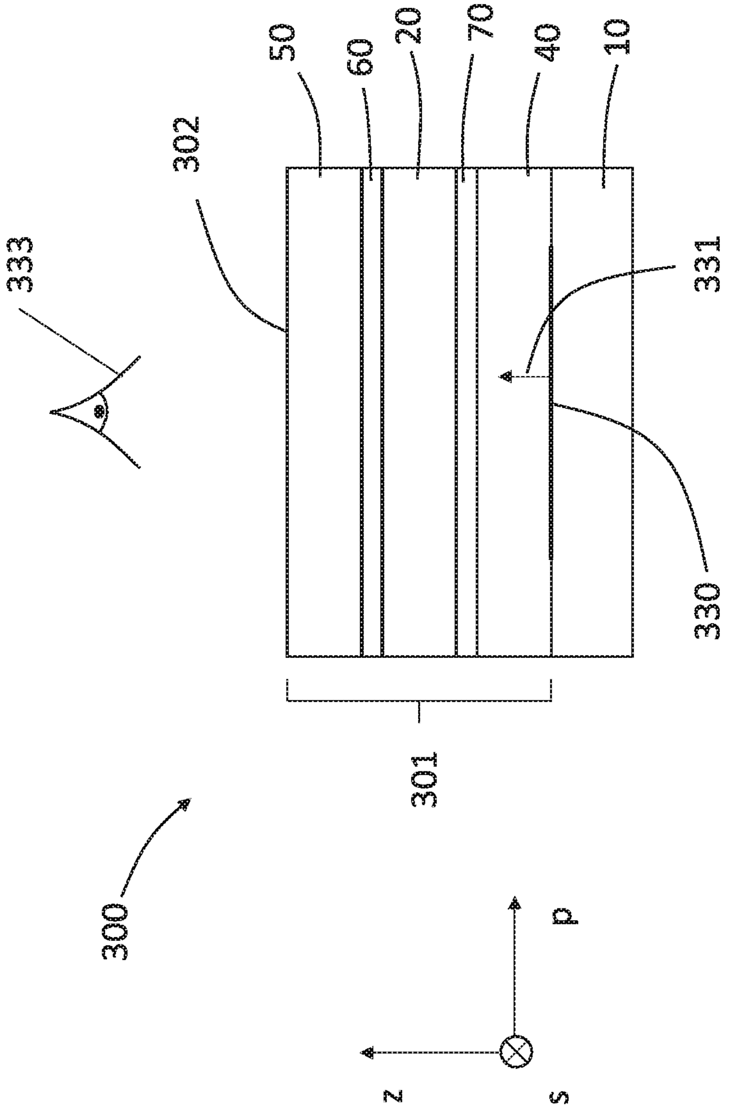
FIG. 1 is a schematic cross-sectional view of an illustrative display system.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

It has been found that the reflective polarizers described herein, according to some embodiments, are useful for improving performance of a display system when the reflective polarizer is disposed to receive a light output of a display panel. For example, in some embodiments, the reflective polarizer can be used in a circular polarizer disposed on an organic light emitting diode (OLED) display, or other emissive display, to improve the brightness of the display and/or the color gamut of the display without causing ghosting or other image degradations. Utilizing a broadband reflective polarizer in the circular polarizer of an OLED display for increasing the brightness of the display due to light recycling is described in U.S. Pat. No. 9,773,847 (Epstein et al.). As described in International Pat. Appl. No. CN2018/105712 (Xu et al.), it has been found that utilizing a notch reflective polarizer having band edges in the visible spectrum can increase the brightness and/or the color gamut of the display while producing substantially less or substantially no ghosting compared to using a broadband reflective polarizer and/or producing a reduced reflection of ambient light compared to using a broadband reflective polarizer. However, it has been found that using a notch reflective polarizer can result in an increased color shift of ambient reflected light and/or of light emitted from the display. According to some embodiments of the present description, a reflective polarizer provides increased recycling of light from blue pixels without producing substantial undesired ambient reflection (e.g., the ambient reflection can be less than about 8%) and without producing undesired coloration of any ambient light that is reflected. According to some embodiments of the present description, the reflective polarizer has a reflection spectrum selected such that a brightness of blue light is increased by at least about 10 percent and such that a substantially white light substantially normally incident on the display system has a low color shift (e.g., lower |a*|, |b*| compared to using conventional notch reflective polarizers and/or or compared to using broadband reflective polarizers). According to some embodiments, the reflective polarizer can provide a brightness increase while providing a lower white point color shift of light reflected from a display system, than from display systems incorporating conventional notch reflective polarizers while providing lower ghosting and/or lower ambient reflection than display systems using broadband reflective polarizers.

The desired properties can be achieved, according to some embodiments, with a reflective polarizer having a blue transmission stop band with a right band edge having a gradual slope such that the reflective polarizer has some reflectance (e.g., at least 15% in a block polarization state) for light having a green and/or a red wavelength. According to some embodiments, the desired properties can be achieved using a reflective polarizer that includes a local blue reflection band and that includes local first and second transmission stop bands disposed between blue and red wavelengths (e.g., peak emission wavelengths). According to some embodiments, the desired properties can be achieved using a reflective polarizer that includes a local blue reflection band and that includes sequentially arranged first, second and third spectrum portions disposed between green and red wavelengths (e.g., peak emission wavelengths) where the second spectrum portion has a lower average change in transmission per change in wavelength than the first and third spectrum portions. The desired properties can be achieved, according to some embodiments, with a reflective polarizer having a higher reflectance (e.g., at least about 10 percent higher) in a blue wavelength range than in a green-red wavelength range for a block polarization state.

FIG. 1 is a schematic cross-sectional view of an illustrative display system 300 including a display panel 10 and a reflective polarizer 20 disposed on the display panel 10, according to some embodiments. The display system 300 can be adapted to display an image 330 to a viewer 333. The reflective polarizer 20 is disposed to receive light 331 emitted by the display panel 10. The display system 300 can further include an absorbing polarizer 50 disposed (e.g., indirectly) on the display panel 10 and a retarder layer 40 disposed between the absorbing polarizer 50 and the display panel 10. In some embodiments, a first adhesive layer 60 bonds the absorbing polarizer 50 to the reflective polarizer 20, and a second adhesive layer 70 bonds the reflective polarizer 20 to the retarder layer 40. The reflective polarizer and the absorbing polarizer, which can be a linear absorbing polarizer, can have substantially aligned pass axes (e.g., aligned to within 20 degrees, or within 10 degrees, or within 5 degrees). In some embodiments, an antireflection coating is disposed on the absorbing polarizer 50 opposite the first adhesive layer 60. In some embodiments, a glass layer is disposed over the absorbing polarizer 50 and the antireflection coating is disposed on the glass layer opposite the absorbing polarizer 50. Additional layer(s), such as an adhesive layer, can be disposed between the retarder layer 40 and the display panel 10, or the retarder layer 40 can be disposed directly on the display panel 10, for example.

For any of the reflective polarizers described herein, an optical stack can include the reflective polarizer and at least one of a retarder layer and an absorbing polarizer. In the embodiment schematically illustrated in FIG. 1, the optical stack 301 includes the reflective polarizer 20 disposed on a retarder layer 40 and further includes an absorbing polarizer 50 disposed on the reflective polarizer 20 opposite the retarder layer 40.

Figure 2:
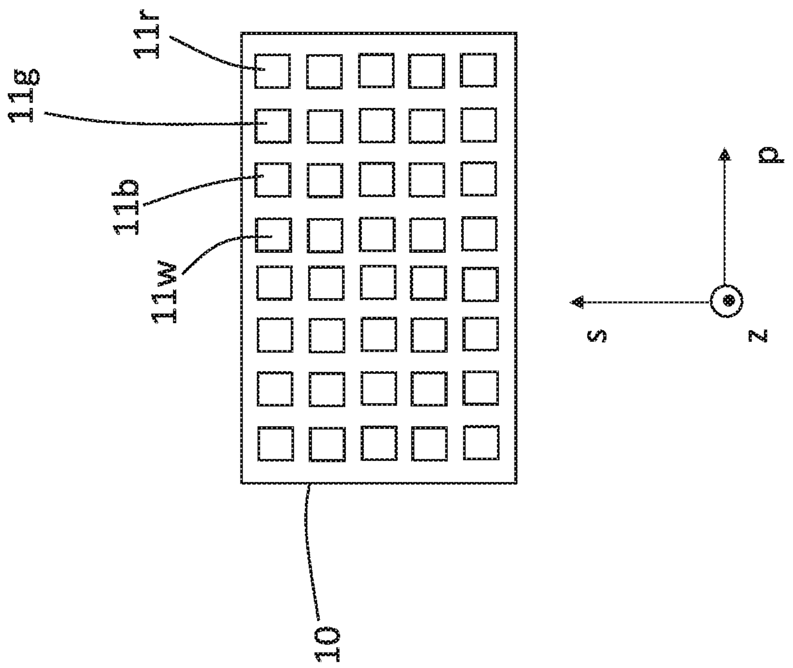
FIG. 2 is a schematic top view of an illustrative display panel.

FIG. 2 is a schematic top view of the display panel 10. In some embodiments, the display panel 10 includes a plurality of at least blue light emitting pixels. In some embodiments, the display panel 10 includes a plurality of at least blue 11*b*, green 11*g*, and red 11*r* light emitting pixels. In some embodiments, the display panel 10 further includes a plurality of white light emitting pixels 11*w*. In some embodiments, the display panel 10 can be or include an organic light emitting diode (OLED) display panel, for example. In other embodiments, the display panel 10 can be a micro-LED display panel, for example.

Figure 3:
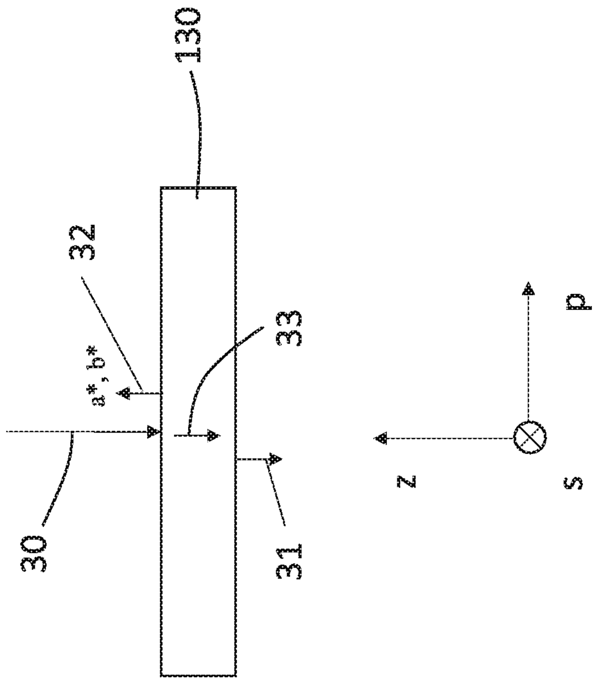
FIG. 3 is a schematic cross-sectional view of a light incident on an object.

In some embodiments, various layers or elements of a display system can be characterized by the optical reflectance, transmittance, and/or absorbance of the layer or element. FIG. 3 is a schematic cross-sectional view of a light 30 incident on a layer or element or system 130. The layer or element or system 130 can represent the reflective polarizer 20 or the absorbing polarizer 50 or the display system 300, for example. A portion 31 of the light 30 can be transmitted, a portion 32 of the light 30 can be reflected, and a portion 33 of the light 30 can be absorbed. In some embodiments, for substantially normally incident light 30 (e.g., within 20 degrees, or within 10 degrees, or within 5 degrees of normally incident), the reflective polarizer 20 reflects at least about 50%, or at least about 60% or at least about 70% of the incident light 30 for at least one wavelength for a first polarization state (e.g., polarized along the p-direction), and transmits at least about 50%, or at least about 60%, or at least about 70% of the incident light for the at least one wavelength for an orthogonal second polarization state (e.g., polarized along the s-direction). In some embodiments, for substantially normally incident light 30, the absorbing polarizer 50 absorbs at least 60% or at least 70% of the incident light 30 for at least one wavelength for a first polarization state (e.g., polarized along the p-direction).

In some embodiments, layer or element or system 130 schematically represents the display system 300 and the incident light 30 is substantially white light. For example, the light 30 can be a CIE (Commission Internationale de l'Eclairage) Standard Illuminant D65 light. In some embodiments, the reflected light 32 is characterized by CIELAB color space coordinates a* and b*. For example, in some embodiments, the incident light 30 is substantially white light and the reflected light 32 has CIELAB color space coordinates a* and b* satisfying |a*|<3 and |b*|<6.

In some embodiments, a display system 300 has a light emission surface 302 and includes a display panel 10 including a plurality of at least blue light emitting pixels 11*b*; and a reflective polarizer 20 disposed on the display panel 10. The reflective polarizer 20 has a transmission spectrum (e.g., Tp depicted in FIG. 5) having a substantially distinct blue transmission stop band 15 for substantially normally incident light polarized along a first direction (p-direction). The reflective polarizer 20 increases a brightness of blue light emitted through the light emission surface 302 by at least about 10 percent, or at least about 15 percent, or at least about 20%. The blue light may have wavelengths in a range of 400 nm to 500 nm, or 420 nm to 480 nm, and/or may be light emitted by the blue light emitting pixels 11*b*. For example, the reflective polarizer 20 can provide a light recycling effect so that light emitted by blue light emitting pixels 11*b* is at least partially recycled so that the brightness of light emitted through the light emission surface 302 when only the blue light emitting pixels 11*b* are on, is increased by at least about 10 percent compared to when the reflective polarizer 20 is omitted.

In some embodiments, for a CIE Standard Illuminant D65 light substantially normally incident on the light emission surface 302, the display system 300 reflects less than 8 percent of the incident light (e.g., reflected light 32 can have less than 8% of the energy of the incident light 30), or between 1 and 8 percent of the incident light, as a reflected light. The reflected light 32 has CIELAB color space coordinates a*, b*, such that |a*|<3 and |b*|<6. In some embodiments, −2.5<a*<0.5 and −5<b*<0. In some embodiments, −2<a*<0 and −4<b*<−1.

In some embodiments, the display panel 10 further includes a plurality of at least green (11*g*) and red (11*r*) light emitting pixels, and the reflective polarizer increases a brightness of substantially white light emitted through the light emission surface by at least 10 percent, or at least about 15 percent. A substantially white light white light may have x and y coordinates on a CIE 1931 xy chromaticity diagram each in a range of about 0.25 to about 0.35, for example. A substantially white light may be referred to as a white light since it will be understood that light characterized by a range of chromaticity coordinates can be considered to be white.

Figure 4:
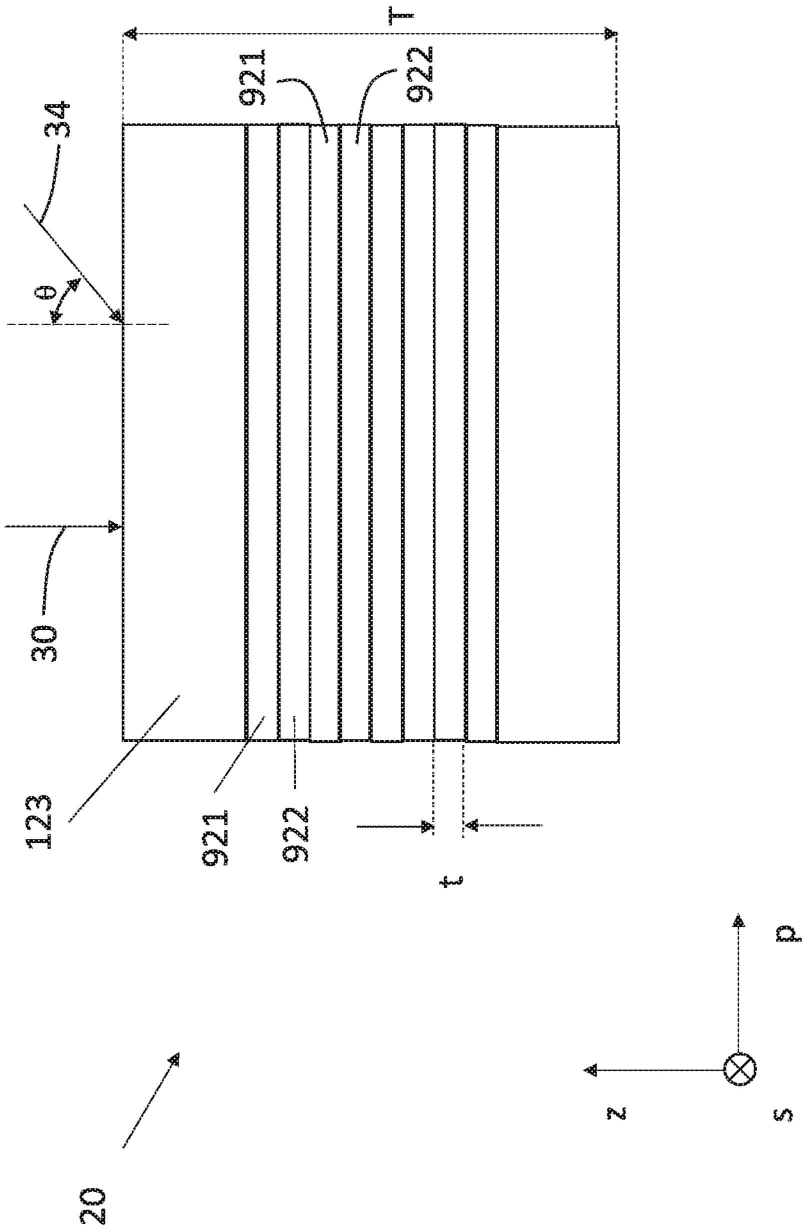
FIG. 4 is a schematic cross-sectional view of an illustrative reflective polarizer.

The reflective polarizer 20 can be a multilayer polymeric reflective polarizer. Multilayer polymeric reflective polarizers are known in the art and are described in U.S. Pat. No. 5,882,774 (Jonza et al.); U.S. Pat. No. 6,179,948 (Merrill et al.); U.S. Pat. No. 6,783,349 (Neavin et al.); U.S. Pat. No. 6,967,778 (Wheatley et al.); and U.S. Pat. No. 9,162,406 (Neavin et al.), for example. FIG. 4 is a schematic cross-sectional view of a reflective polarizer 20 according to some embodiments. The reflective polarizer 20 can include a plurality of alternating polymeric first (921) and second (922) layers which are arranged sequentially along the z-direction (thickness direction). The thicknesses profile (different thicknesses of the different layers) of the first and second layers can be selected to provide desired reflection band(s), as is known in the art. In some embodiments, the reflective polarizer 20 has an average thickness T (unweighted mean thickness over an entire area of the reflective polarizer) less than about 30 micrometers, or less than about 20 micrometers. In some embodiments, the plurality of alternating polymeric first and second layers number at least 30 in total (e.g., 50 to 500 layers or 50 to 300 layers), and an average thickness t of each first and second layer is less than about 500 nm, or less than about 400 nm, or less than about 300 nm. In some embodiments, the reflective polarizer 20 further includes skin layer(s) 123 at outermost major surface(s) of the reflective polarizer 20. The skin layer(s) 123 can have a thickness greater than about 1 micrometer (e.g., 2 to 20 micrometers), for example. In some embodiments, the reflective polarizer 20 can further include protective boundary layer(s) disposed between packets of alternating first and second layers. A substantially normally incident light 30 and a light 34 incident on the reflective polarizer at an angle of incidence θ are schematically illustrated.

Figure 5:
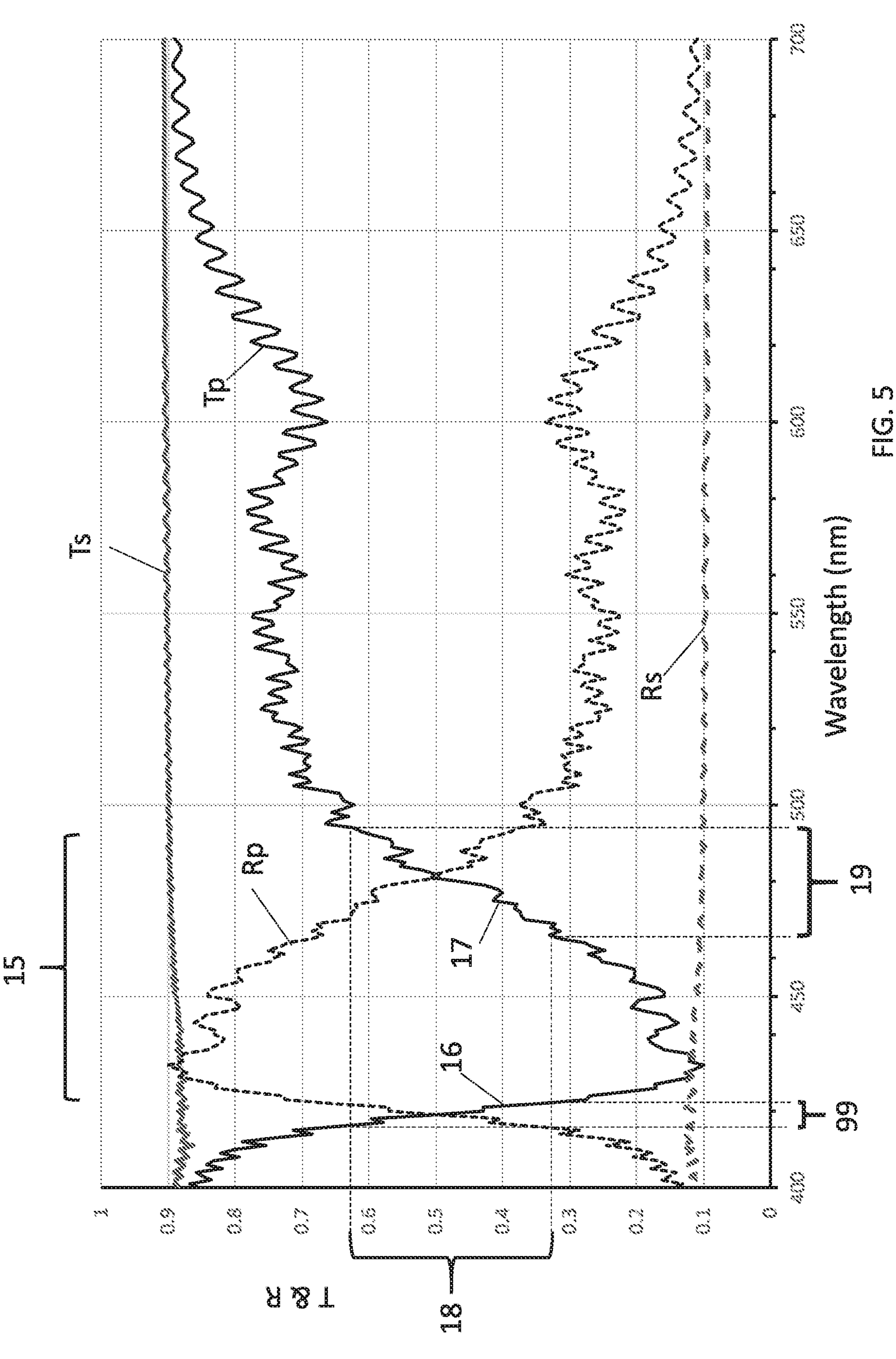
FIG. 5 is a plot of transmittance and reflectance versus wavelength for an illustrative reflective polarizer.

FIG. 5 is a plot of transmittance and reflectance for an illustrative reflective polarizer according to some embodiments. The reflectances Rp and Rs for substantially normally incident light polarized along first (p) and second (s) directions, respectively, are shown, as is the transmittances Tp and Ts for substantially normally incident light polarized along the first (p) and second (s) directions, respectively.

Figure 6:
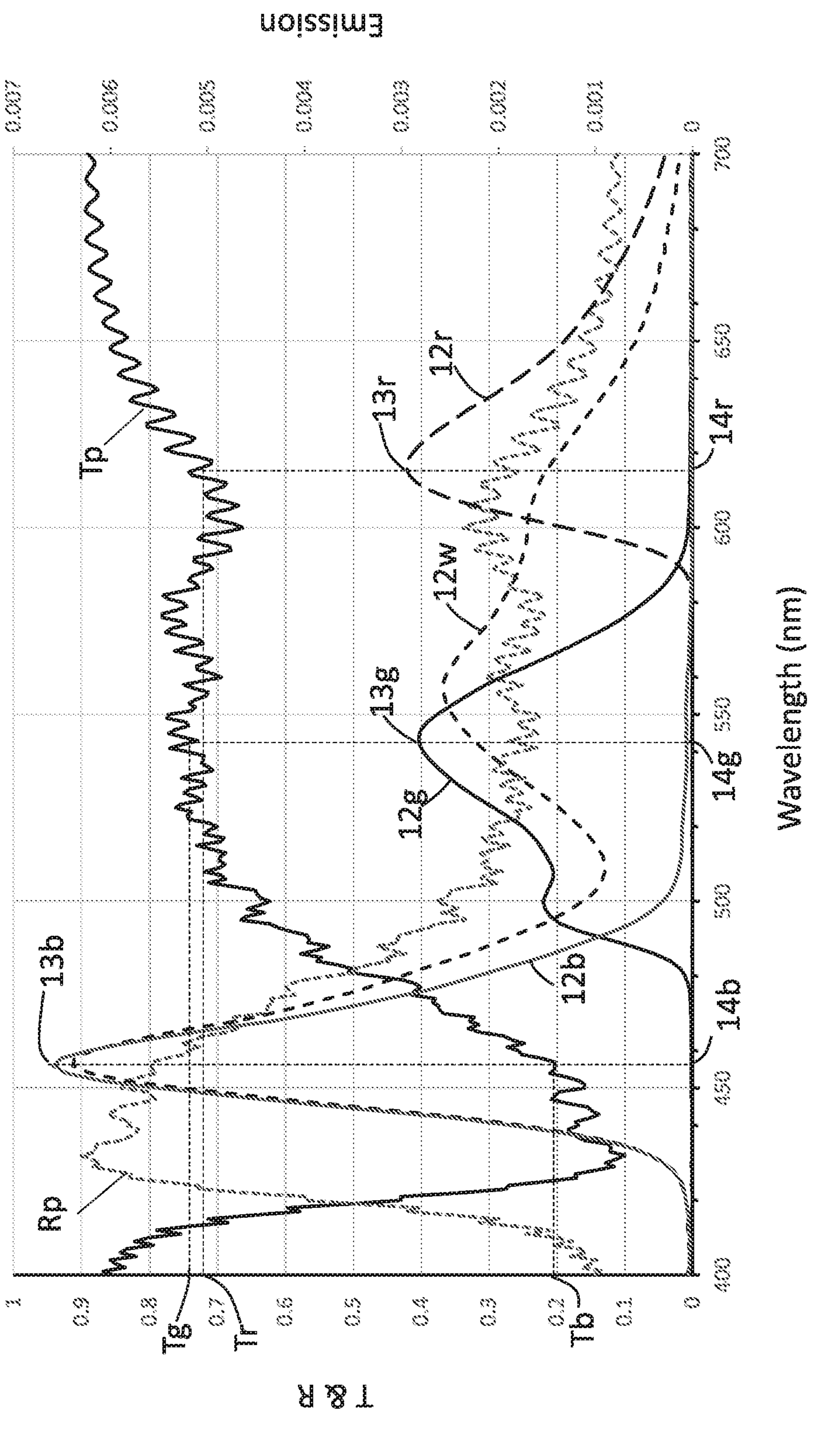
FIGS. 6-7 are plots of transmittance and reflectance versus wavelength for the reflective polarizer of FIG. 5 along with emission spectra of light emissive pixels from illustrative display panels.
Figure 7:
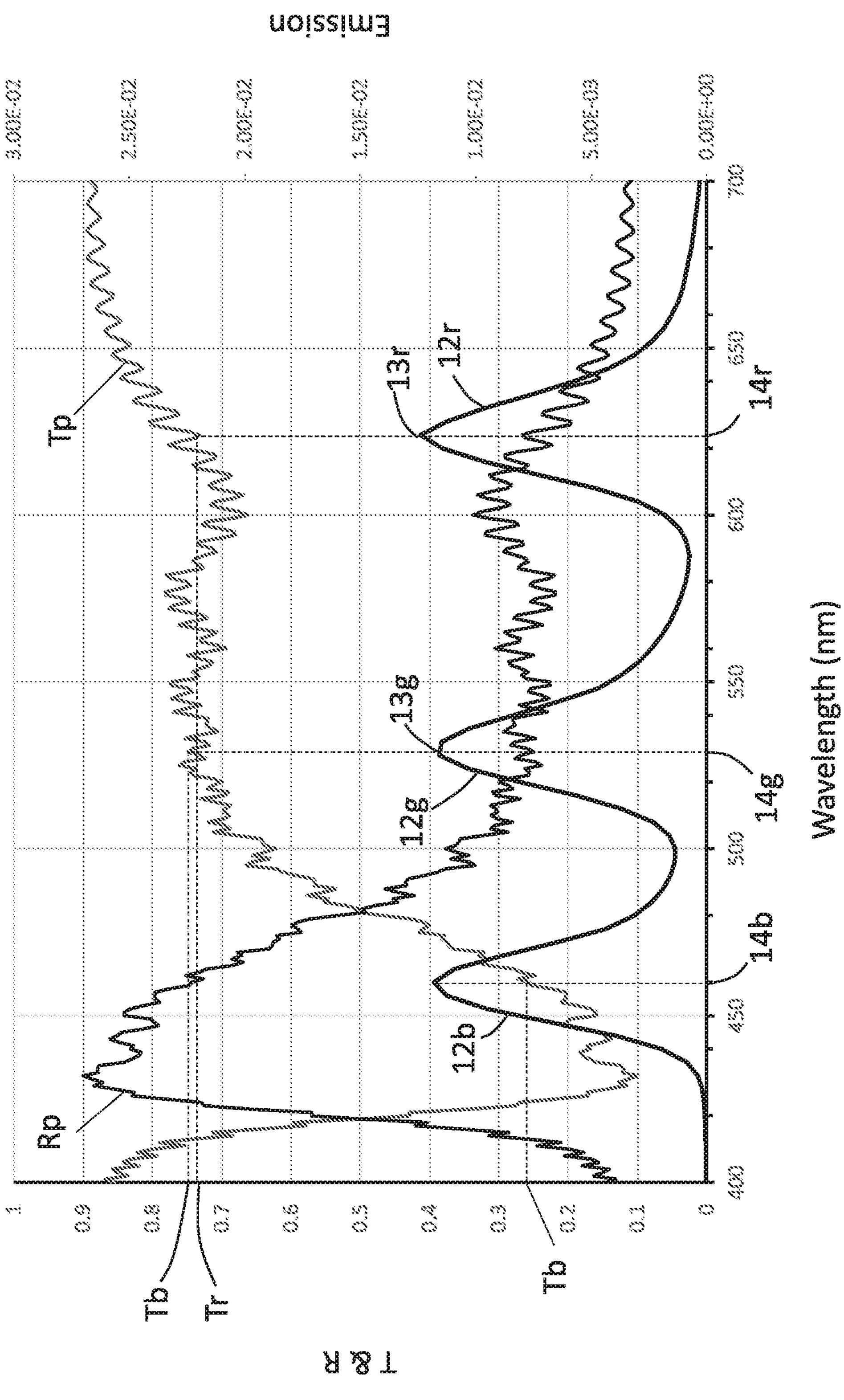

FIGS. 6-7 are plots of transmittance and reflectance for the reflective polarizer of FIG. 5 along with emission spectra (in arbitrary units) of illustrative display panels. The display panel has a plurality of at least blue (11*b*), green (11*g*) and red (11*r*) light emitting pixels having respective blue (12*b*), green (12*g*) and red (12*r*) emission spectra including respective blue (13*b*), green (13*g*) and red (13*r*) emission peaks at respective blue (14*b*), green (14*g*) and red (14*r*) peak wavelengths. In the embodiment illustrated in FIG. 6, the display panel also includes white light emitting pixels 11*w* having white emission spectra 12*w*.

In some embodiments, a reflective polarizer 20 includes a plurality of alternating polymeric layers, such that for substantially normally incident light 30 and for a blue wavelength (e.g., 14*b*), a green wavelength (e.g., 14*g*), and a red wavelength (e.g., 14*r*), the reflective polarizer: has a transmission spectrum (Tp) including a substantially distinct (e.g., distinct or recognizably different from the remaining portion of the spectrum) blue transmission stop band 15 for the incident light polarized along a first direction (p-direction); reflects (Rp) at least about 50% of the incident light polarized along the first direction for the blue wavelength; transmits (Ts) at least about 50% of the incident light polarized along an orthogonal second direction (s-direction) for each of the blue, green and red wavelengths; and transmits (Tp) between about 50% and about 95% (or between about 60% and about 95%) of the incident light polarized along the first direction for each of the green and red wavelengths. In some embodiments, the reflective polarizer 20 reflects at least about 60% of the incident light polarized along the first direction for the blue wavelength. In some embodiments, the reflective polarizer transmits at least about 60%, or at least about 70%, or at least about 80% of the incident light polarized along the second direction (s-direction) for each of the blue, green and red wavelengths.

The blue wavelength can be any wavelength between 400 nm and 500 nm and is typically in a range of 430 nm to 490 nm. The green wavelength can be any wavelength between 500 nm and 600 nm and is typically in a range of 510 nm to 570 nm. The red wavelength can be any wavelength between 600 nm and 700 nm and is typically in a range of 600 nm to 660 nm. The blue, green, and red wavelengths can correspond to blue, green, and red peak emission wavelengths of a display panel, for example.

The substantially distinct blue transmission stop band 15 has a first band edge 16 where the transmittance of the reflective polarizer decreases with increasing wavelength and an opposing second band edge 17 where the transmittance of the reflective polarizer increases with increasing wavelength. The first and second band edges having respective first and second slope magnitudes S1 and S2. The slopes can be taken to be the slopes of best line fits to the band edges over a wavelength range where the transmittance shifts from about 1.2 times a minimum transmittance in the band to about 80 percent of an average transmittance on either side of the band. Alternatively, the slopes can be taken to be a ratio of a change in transmittance by a fixed amount (e.g., a change of 0.3 or 30%) divided by the wavelength range over which this change occurs. For example, in FIG. 5, S1 can be taken to be the change in transmittance 18 divided by the wavelength range 99 and S2 can be taken to be the change in transmittance 18 divided by the wavelength range 19. In some embodiments, S1/S2≥2, or S1/S2≥3, or S1/S2≥4.

In some embodiments, a reflective polarizer 20 includes a plurality of alternating polymeric layers, such that for substantially normally incident light 30 and for a blue wavelength (e.g., 14*b*), a green wavelength (e.g., 14*g*), and a red wavelength (e.g., 14*r*), the reflective polarizer: reflects (Rp) at least about 50% of the incident light polarized along a first direction (p-direction) for the blue wavelength; transmits (Ts) at least about 50% of the incident light polarized along an orthogonal second direction (s-direction) for each of the blue, green and red wavelengths; and transmits Tb, Tg and Tr % of the incident light polarized along the first direction at the respective blue, green and red wavelengths. Tb is less than each of Tg and Tr by at least 30% (or, equivalently, by at least 0.3 when expressed in range of 0 to 1). Tg and Tr are within 20% (or, equivalently, 0.2 when expressed in a range of 0 to 1) of each other. In some embodiments, Tg and Tr are within 10% of each other, or within 7% of each other. The reflection and transmission can be in the ranges described elsewhere. A smallest wavelength range (e.g., 19) over which the transmittance of the reflective polarizer 20 for the incident light polarized along the first direction increases with increasing wavelength by at least about 30% is at least 25 nm wide and disposed between the blue and green wavelengths.

In some embodiments, a display system includes the reflective polarizer of FIGS. 5-6 disposed on a plurality of the at least blue, green and red light emitting pixels of a display panel where the blue, green and red wavelengths described above are respective blue (14*b*), green (14*g*) and red (14*r*) peak wavelengths of respective blue (13*b*), green (13*g*) and red (13*r*) emission peaks of the respective blue, green and red light emitting pixels. The reflective polarizer can be disposed to receive a light output of the light emitting pixels.

In some embodiments, a display system 300 includes a display panel 10 including a plurality of at least blue (11*b*), green (11*g*) and red (11*r*) light emitting pixels having respective blue (12*b*), green (12*g*) and red (12*r*) emission spectra including respective blue (13*b*), green (13*g*) and red (13*r*) emission peaks at respective blue (14*b*), green (14*g*) and red (14*r*) peak wavelengths; and a reflective polarizer (20) disposed on the plurality of the at least blue, green and red light emitting pixels, such that for substantially normally incident light 30, the reflective polarizer 20: includes a transmission spectrum (Tp) including a substantially distinct blue transmission stop band 15 for the incident light polarized along a first direction (p-direction); reflects (Rp) at least about 50% of the incident light polarized along the first direction for the blue peak wavelength; transmits (Ts) at least about 50% of the incident light polarized along an orthogonal second direction (s-direction) for each of the blue, green and red peak wavelengths; and transmits (Tp) between about 50% and about 95% (or between about 60% and about 95%) of the incident light polarized along the first direction for each of the green and red peak wavelengths. In some embodiments, the reflective polarizer 20 reflects at least about 60% of the incident light polarized along the first direction for the blue peak wavelength 14*b*. In some embodiments, the reflective polarizer transmits at least about 60%, or at least about 70%, or at least about 80% of the incident light polarized along the second direction (s-direction) for each of the blue, green and red peak wavelengths. The substantially distinct blue transmission stop band includes a first band edge 16 where the transmittance of the reflective polarizer decreases with increasing wavelength and an opposing second band edge 17 where the transmittance of the reflective polarizer increases with increasing wavelength. The first and second band edges having respective first and second slope magnitudes S1 and S2, where S1/S2≥2. In some embodiments, S1/S2≥3, or S1/S2≥4.

In some embodiments, a display system 300 incudes a display panel 10 including a plurality of at least blue (11*b*), green (11*g*) and red (11*r*) light emitting pixels having respective blue (12*b*), green (12*g*) and red (12*r*) emission spectra including respective blue (13*b*), green (13*g*) and red (13*r*) emission peaks at respective blue (14*b*), green (14*g*) and red (14*r*) peak wavelengths; and a reflective polarizer (20) disposed on the plurality of the at least blue, green and red light emitting pixels, such that for substantially normally incident light 30, the reflective polarizer 20: reflects (Rp) at least about 50% of the incident light polarized along the first direction for the blue peak wavelength; transmits (Ts) at least about 50%, or at least about 70% of the incident light polarized along an orthogonal second direction (s-direction) for each of the blue, green and red peak wavelengths; and transmits Tb, Tg and Tr % of the incident light polarized along the first direction at the respective blue, green and red peak wavelengths, where Tb is less than each of Tg and Tr by at least 30%, and Tg and Tr are within 20% of each other. The reflection and transmission can be in the ranges described elsewhere. A smallest wavelength range (e.g., 19) over which the transmittance of the reflective polarizer for the incident light polarized along the first direction increases with increasing wavelength by at least about 30% is at least 25 nm wide and is disposed between the blue (14*b*) and green (14*g*) peak wavelengths. Alternatively, or in addition, in some embodiments, the transmittance of the reflective polarizer 20 for the incident light polarized along the first direction increases by less than about 30% over a first wavelength range that is at least 30 nm wide and disposed between the blue (14*b*) and green (14*g*) peak wavelengths. In some embodiments, Tg and Tr are within 10% of each other, or within 7% of each other.

Figure 8:
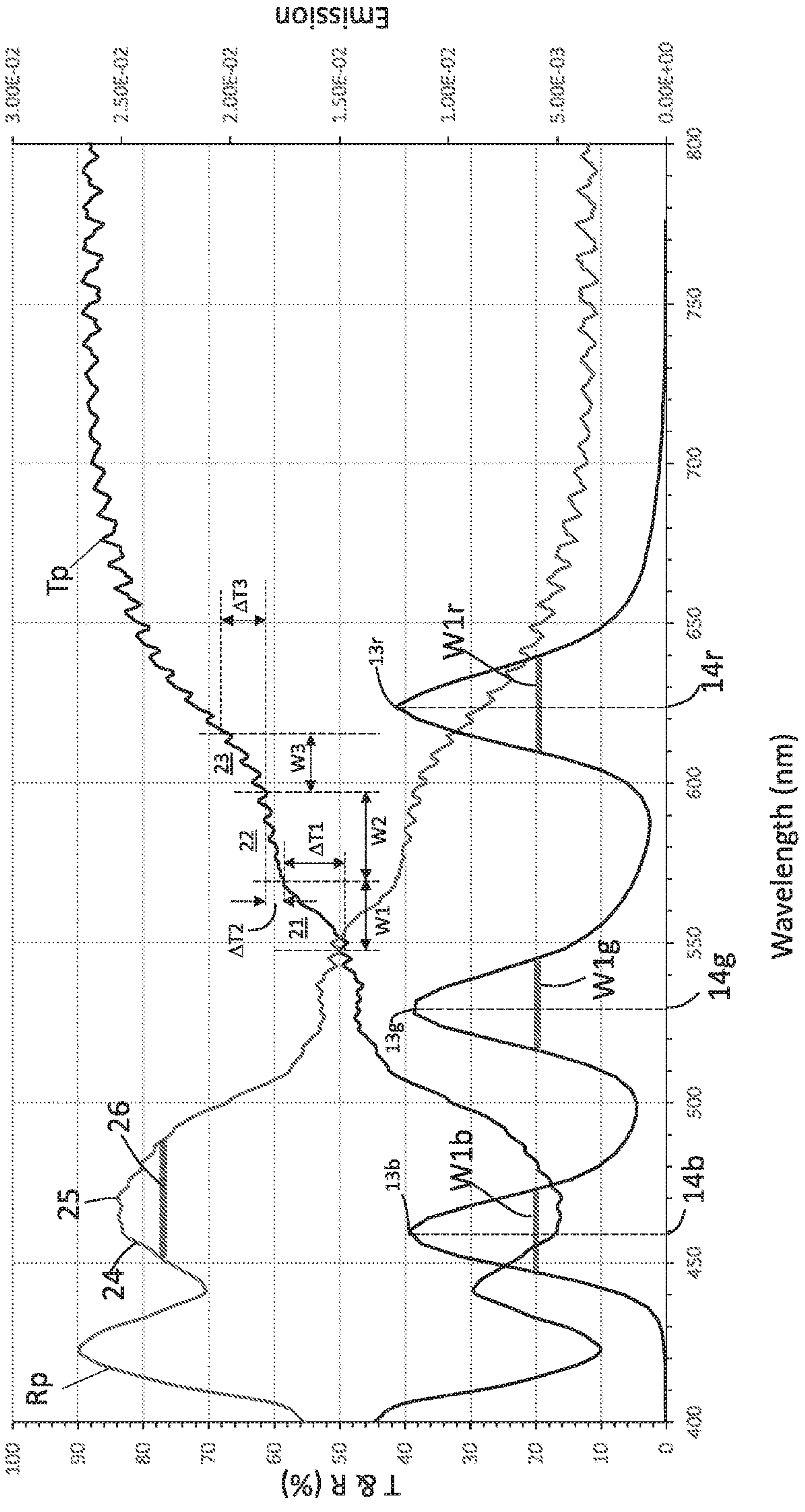
FIGS. 8-9 are plots of transmittance and reflectance versus wavelength for illustrative reflective polarizers along with emission spectra of light emissive pixels from an illustrative display panel.

FIG. 8 is a plot of transmittance and reflectance for an illustrative reflective polarizer according to some embodiments. The reflectance Rp and transmittance Tp for substantially normally incident light polarized along the first direction (p-direction) are shown. Also shown is the emission spectra of an illustrative display panel. The reflectance Rs and transmittance Ts for substantially normally incident light polarized along the second direction (s-direction) can be approximately as shown in FIG. 5, for example. The reflective polarizer could alternatively be disposed on a display panel having the emission spectra depicted in FIG. 6, for example.

In some embodiments, a display system 300 includes a display panel 10 including a plurality of at least blue (11*b*), green (11*g*) and red (11*r*) light emitting pixels having respective blue (12*b*), green (12*g*) and red (12*r*) emission spectra comprising respective blue (13*b*), green (13*g*) and red (13*r*) emission peaks at respective blue (14*b*), green (14*g*) and red (14*r*) peak wavelengths with respective blue (W1*b*), green (W1*g*) and red (W1*r*) full width at half maxima (FWHMs); and a reflective polarizer 20 disposed on the plurality of pixels, such that for substantially normally incident light 30, the reflective polarizer 20: has a reflection spectrum (Rp) for the incident light polarized along a first direction (p-direction) where the reflection spectrum includes a local blue reflection band 24 including corresponding local blue maximum 25 and local full width at half the local blue maximum (FWHM) 26; reflects (Rp) at least about 50% of the incident light polarized along the first direction at the blue peak wavelength; transmits (Ts) at least about 50% or at least about 70% of the incident light polarized along an orthogonal second direction (s-direction) at each of the blue, green and red peak wavelengths; and has a transmission spectrum (Tp) for the incident light polarized along the first direction that includes sequentially arranged first (21), second (22) and third (23) spectrum portions where the second spectrum portion joins the first and the third spectrum portions. The reflection and transmission can be in the ranges described elsewhere. For each spectrum portion: the spectrum portion is disposed between the blue and red peak wavelengths and has a width W (denoted W1, W2, W3 for the respective first, second and third spectrum portions in FIG. 8), where W≥10 nm; the transmission spectrum increases by ΔT (denoted ΔT1, ΔT2, ΔT3 for the respective first, second and third spectrum portions in FIG. 8) across the width W of the spectrum portion, where ΔT/W for the second spectrum portion 22 is less than ΔT/W for each of the first and third spectrum portions 21 and 23. In some embodiments, the width W of each spectrum portion is at least 12 nm or at least 15 nm. The local FWHM 26 of the reflective polarizer 20 at least partially overlaps the FWHM W1*b* of the blue emission spectrum. In some embodiments, the local FWHM 26 of the reflective polarizer 20 overlaps at least 60%, or at least 70%, or at least 80% of the FWHM W1*b* of the blue emission spectrum. A result of the first, second and third spectrum portions can be to lower the transmission Tp around the red peak wavelength 14*r* which can be desired, according to some embodiments, to adjust a color (e.g., reduce a color shift) of substantially white light reflected from the display system.

The reflective polarizer of FIG. 8 can alternatively be provided without the display panel (e.g., for subsequent use with the display panel or for other applications) where the local FWHM 26 at least partially overlaps a blue wavelength range and where each of the first (21), second (22) and third (23) spectrum portions are disposed between 500 nm and 700 nm.

Figure 9:
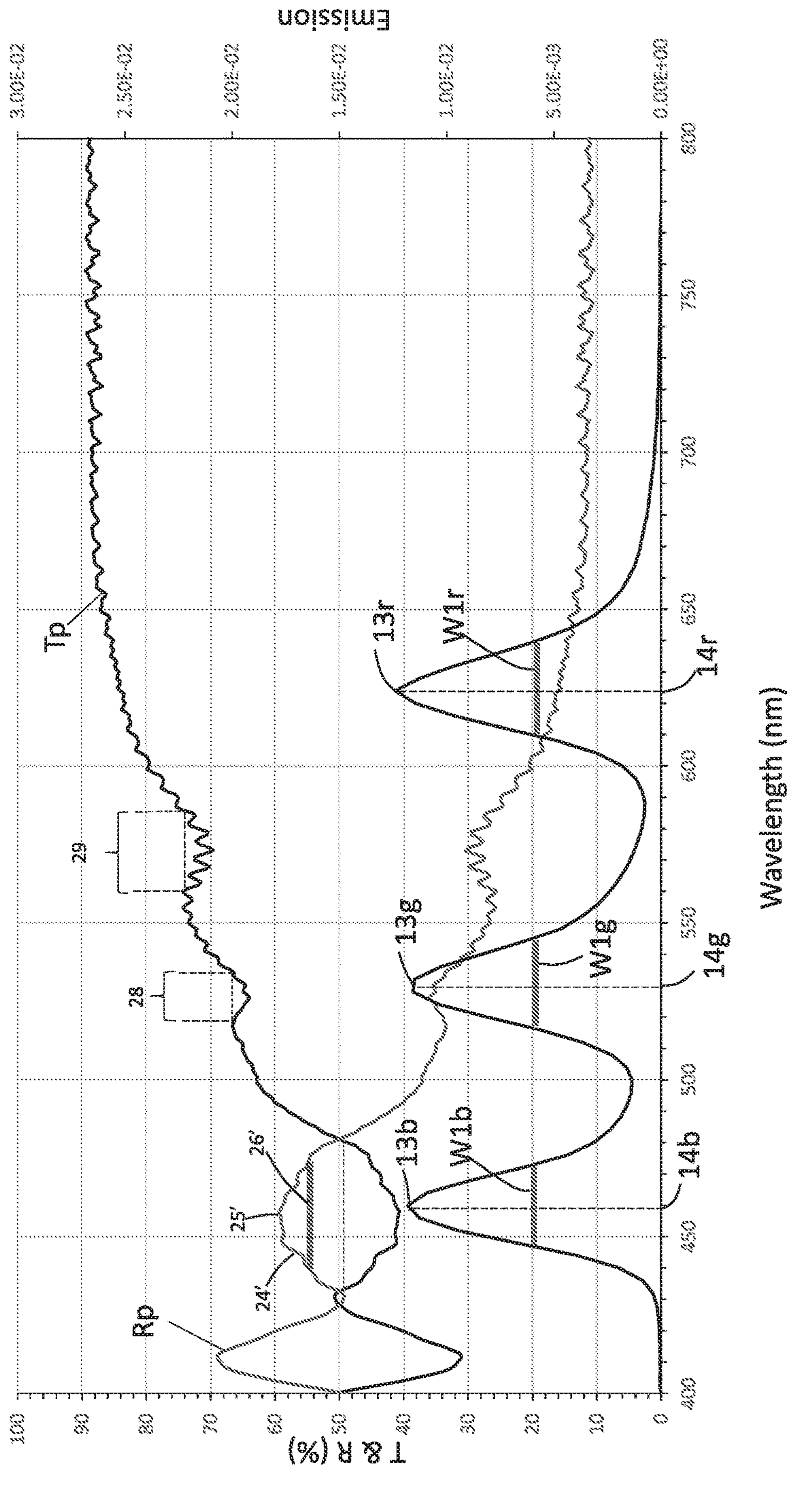

FIG. 9 is a plot of transmittance and reflectance for an illustrative reflective polarizer according to some embodiments. The reflectance Rp and transmittance Tp for substantially normally incident light polarized along the first direction (p-direction) are shown. Also shown is the emission spectra of an illustrative display panel. The reflectance Rs and transmittance Ts for substantially normally incident light polarized along the second direction (s-direction) can be approximately as shown in FIG. 5, for example. The reflective polarizer could alternatively be disposed on a display panel having the emission spectra depicted in FIG. 6, for example.

In some embodiments, a display system 300 includes a display panel 10 including a plurality of at least blue (11*b*), green (11*g*) and red (11*r*) light emitting pixels having respective blue (12*b*), green (12*g*) and red (12*r*) emission spectra comprising respective blue (13*b*), green (13*g*) and red (13*r*) emission peaks at respective blue (14*b*), green (14*g*) and red (14*r*) peak wavelengths with respective blue (W1*b*), green (W1*g*) and red (W1*r*) full width at half maxima (FWHMs); and a reflective polarizer 20 disposed on the plurality of pixels, such that for substantially normally incident light 30, the reflective polarizer 20: has a reflection spectrum (Rp) for the incident light polarized along a first direction (p-direction), where the reflection spectrum includes a local blue reflection band 24' having corresponding local blue maximum 25' and local full width at half the local blue maximum (FWHM) 26'; reflects (Rp) at least about 50% of the incident light polarized along the first direction at the blue peak wavelength; transmits (Ts) at least about 50% or at least about 70% of the incident light polarized along an orthogonal second direction (s-direction) at each of the blue, green and red peak wavelengths; and has a transmission spectrum (Tp) for the incident light polarized along the first direction that includes spaced apart local first (28) and second (29) transmission stop bands disposed between the blue and red peak wavelengths where each stop band is at least 7 nm wide. The reflection and transmission can be in the ranges described elsewhere. In some embodiments, each stop band is at least 10 nm wide, or at least 12 nm wide, or at least 15 nm wide. In some embodiments, at least one of the stop bands is at least 15 nm wide or at least 20 nm wide. The local FWHM 26' of the reflective polarizer 20 at least partially overlaps the FWHM W1*b* of the blue emission spectrum. In some embodiments, the local FWHM 26' of the reflective polarizer 20 overlaps at least 60%, or at least 70%, or at least 80% of the FWHM W1*b* of the blue emission spectrum. A result of the local first and second transmission stop bands can be to provide enhanced recycling of light in desired green or green-red wavelength ranges, according to some embodiments, to adjust a color of substantially white light emitted by the display system. Alternatively, or in addition, the combination of the local blue reflection band 24' and the local first and second transmission stop bands 28 and 29 can, according to some embodiments, reduce a color shift of substantially white light reflected from the display system.

The reflective polarizer of FIG. 9 can alternatively be provided without the display panel (e.g., for subsequent use with the display panel or for other applications) where the local FWHM 26' at least partially overlaps a blue wavelength range and where each of the first (28) and second (29) and stop bands is disposed between 400 nm and 700 nm or between 440 nm and 650 nm.

Figure 10:
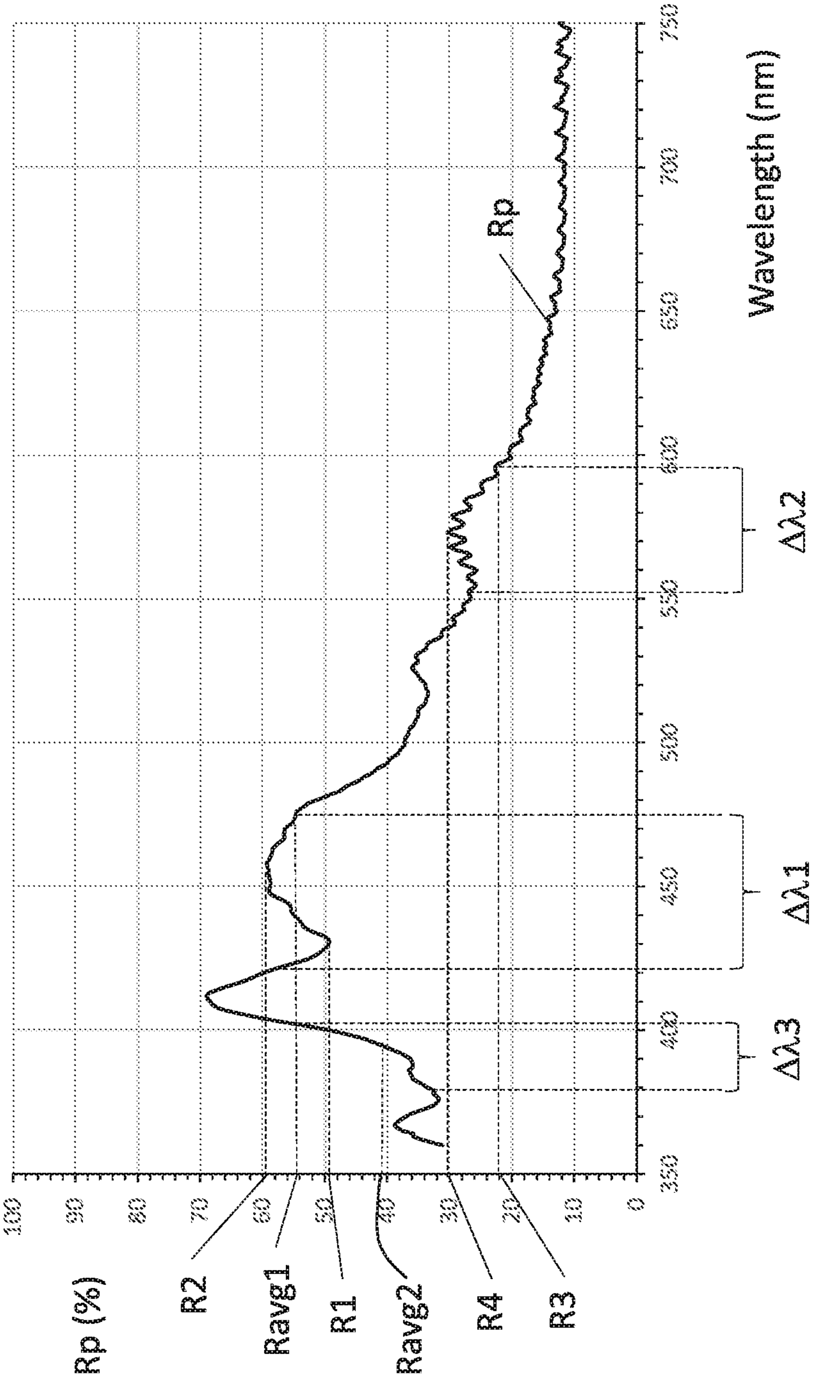
FIG. 10 is a plot of reflectance versus wavelength for an illustrative reflective polarizer.
Figure 11:
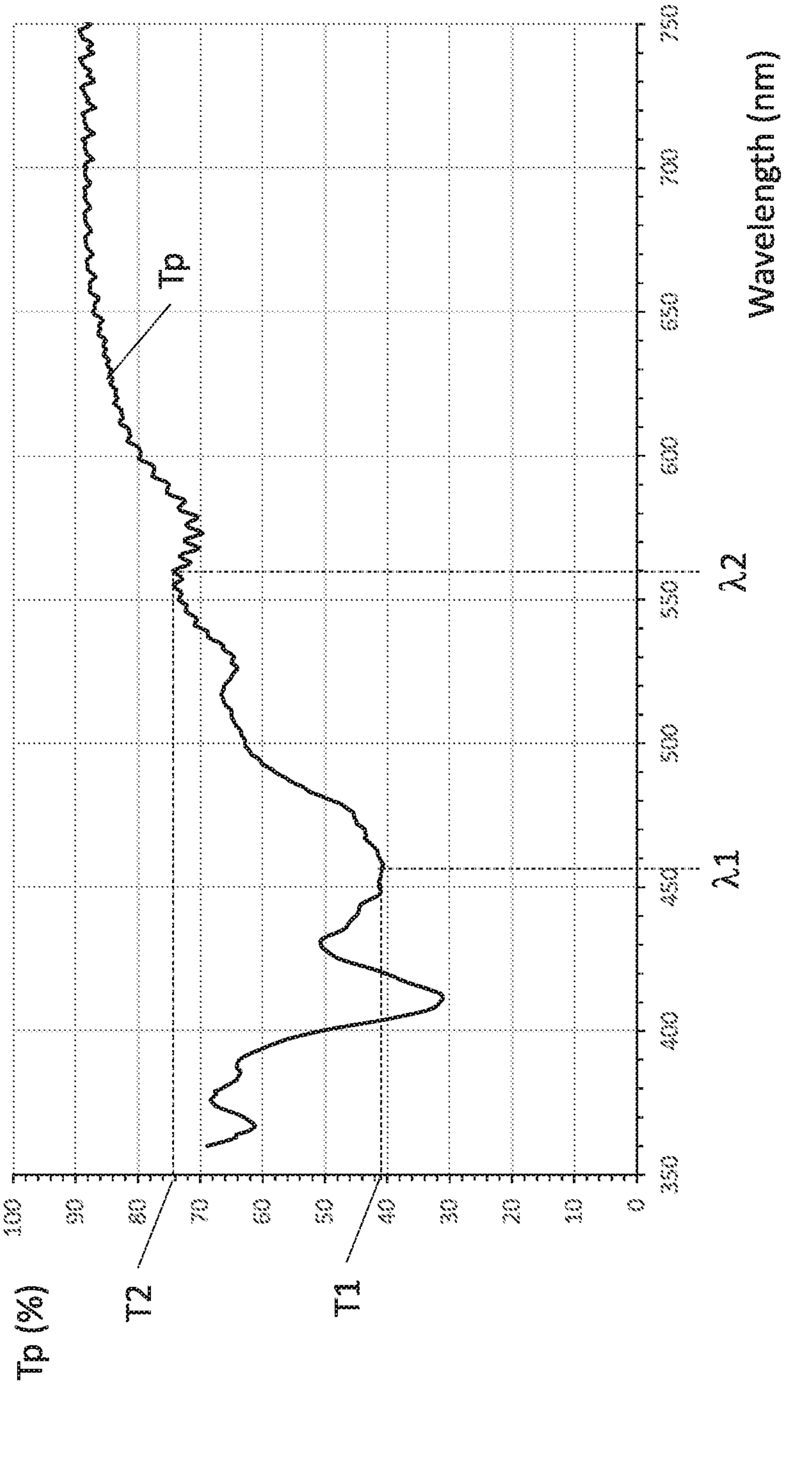
FIG. 11 is a plot of transmittance versus wavelength for an illustrative reflective polarizer.

FIGS. 10-11 are plots of the reflectance Rp and transmittance Tp, respectively, for the reflective polarizer of FIG. 9 for substantially normally incident light polarized along the first direction (p-direction).

In some embodiments, a reflective polarizer 20 includes a plurality of alternating polymeric layers, such that for substantially normally incident light 30, the reflective polarizer 20 has: a reflectance in a range of 30% to 70% throughout a first wavelength range Δλ1 for a first polarization state (e.g., polarized along the p-direction) where the first wavelength range Δλ1 is at least 15 nm wide and disposed between 400 nm and 500 nm; a reflectance in a range of 15% to 40% throughout a second wavelength range Δλ2 for the first polarization state where the second wavelength range Δλ2 is at least 15 nm wide and disposed between 550 nm and 650 nm; and an average transmittance of greater than 70%, or greater than 75%, or greater than 80%, or greater than 85% over a wavelength range extending at least from 450 nm to 650 nm for a second polarization state (e.g., polarized along the s-direction) orthogonal to the first polarization state. In some embodiments, the reflectance is in a range of 40% to 70% or 45% to 65% throughout the first wavelength range Δλ1 for the first polarization state. In some such embodiments, or in other embodiments, the reflectance is in a range of 18% to 40% or 20% to 35% throughout the second wavelength range Δλ2 for the first polarization state. The first and second wavelength ranges are continuous wavelength ranges. In some embodiments, the first wavelength range Δλ1 is at least 20 nm wide, or at least 25 nm wide, or at least 30 nm wide. In some such embodiments or in other embodiments, the second wavelength range Δλ2 is at least 20 nm wide, or at least 25 nm wide, or at least 30 nm wide. In some embodiments, at least one of the first and second wavelength ranges is at least 30 nm wide or at least 35 nm wide. In some embodiments, the first wavelength range is disposed between about 420 nm and about 490 nm. In some embodiments, the second wavelength range is disposed between about 550 nm and about 625 nm.

In the illustrated embodiment, the reflective polarizer has minimum and maximum reflectances R1 and R2 in the first wavelength range Δλ1 and minimum and maximum reflectances R3 and R4 in the second wavelength range Δλ2 for substantially normally incident light having the first polarization state. A maximum reflectance R4 in the second wavelength range Δλ2 for the first polarization state is less than 0.9 times, or less than 0.8 times, or less than 0.7 times a minimum reflectance R1 in the first wavelength range Δλ1 for the first polarization state. In some embodiments, a difference between maximum and minimum reflectances (R2 (expressed as a %)−R1 (expressed as a %)) in the first wavelength range is less than 20%, or less than 15%, or less than 12%. In some embodiments, a difference between maximum and minimum reflectances (R4 (expressed as a %)−R3 (expressed as a %)) in the second wavelength range is less than 20%, or less than 15%, or less than 12%.

In some embodiments, for substantially normally incident light 30 having the first polarization state and for a third wavelength range Δλ3 being at least 15 nm wide or at least 20 nm wide and disposed between 380 nm and the first wavelength range Δλ1, the reflective polarizer has an average reflectance over the third wavelength range Ravg2 being at least 10% less than an average reflectance Ravg1 over the first wavelength range Δλ1. In some embodiments, Ravg2 is at least 20% less than Ravg1.

In some embodiments, for substantially normally incident light 30 and for the first polarization state, the reflective polarizer transmits T1 and T2% of the incident light at respective first (λ1) and second (λ2) wavelengths in the respective first (Δλ1) and second (Δλ2) wavelength ranges, where T1 is less than T2 by at least 25%. In some embodiments, T1 is less than T2 by at least 30%. In some such embodiments, for substantially normally incident light 30 and for the first polarization state, a smallest wavelength range over which a transmittance of the reflective polarizer increases with increasing wavelength by at least about 30% is at least 25 nm wide, or at least 50 nm wide. Alternatively, or in addition, in some embodiments, the transmittance of the reflective polarizer 20 for the incident light polarized along the first direction increases by less than about 30% over a first wavelength range that is at least 30 nm wide and disposed between blue (e.g., 14*b*) and green (e.g., 14*g*) wavelengths.

In some embodiments, a display system 300 includes a display panel 10 and a reflective polarizer 40 (e.g., having reflectance and transmittance as shown in FIGS. 9-11) disposed on the display panel 10 to receive light 331 emitted by the display panel 10. The display panel 10 includes a plurality of at least blue, green and red light emitting pixels having respective blue, green and red emission spectra comprising respective blue (13*b*), green (13*g*) and red (13*r*) emission peaks at respective blue (14*b*), green (14*g*), and red (14*r*) peak wavelengths. In some embodiments, the blue peak wavelength 14*b* is in the first wavelength range Δλ1 as illustrated in FIGS. 9-10. Alternatively, or in addition, the second wavelength range Δλ2 can be disposed between the green (14*g*) and red (14*r*) peak wavelengths as illustrated in FIGS. 9-10.

The retarder layer 40 can include films, coatings or a combination of films and coatings. Exemplary films include birefringent polymer film retarders, such as those available from Meadowlark Optics (Frederick, CO), for example. Exemplary coatings for forming a retarder layer include the linear photopolymerizable polymer (LPP) materials and the liquid crystal polymer (LCP) materials described in U.S. Pat. App. Pub. Nos. 2002/0180916 (Schadt et al.), 2003/028048 (Cherkaoui et al.), 2005/0072959 (Moia et al.) and 2006/0197068 (Schadt et al.), and in U.S. Pat. No. 6,300,991 (Schadt et al.). Suitable LPP materials include ROP-131 EXP 306 LPP and suitable LCP materials include ROF-5185 EXP 410 LCP, both available from ROLIC Technologies Ltd. (Allschwil, Switzerland).

Figure 12:
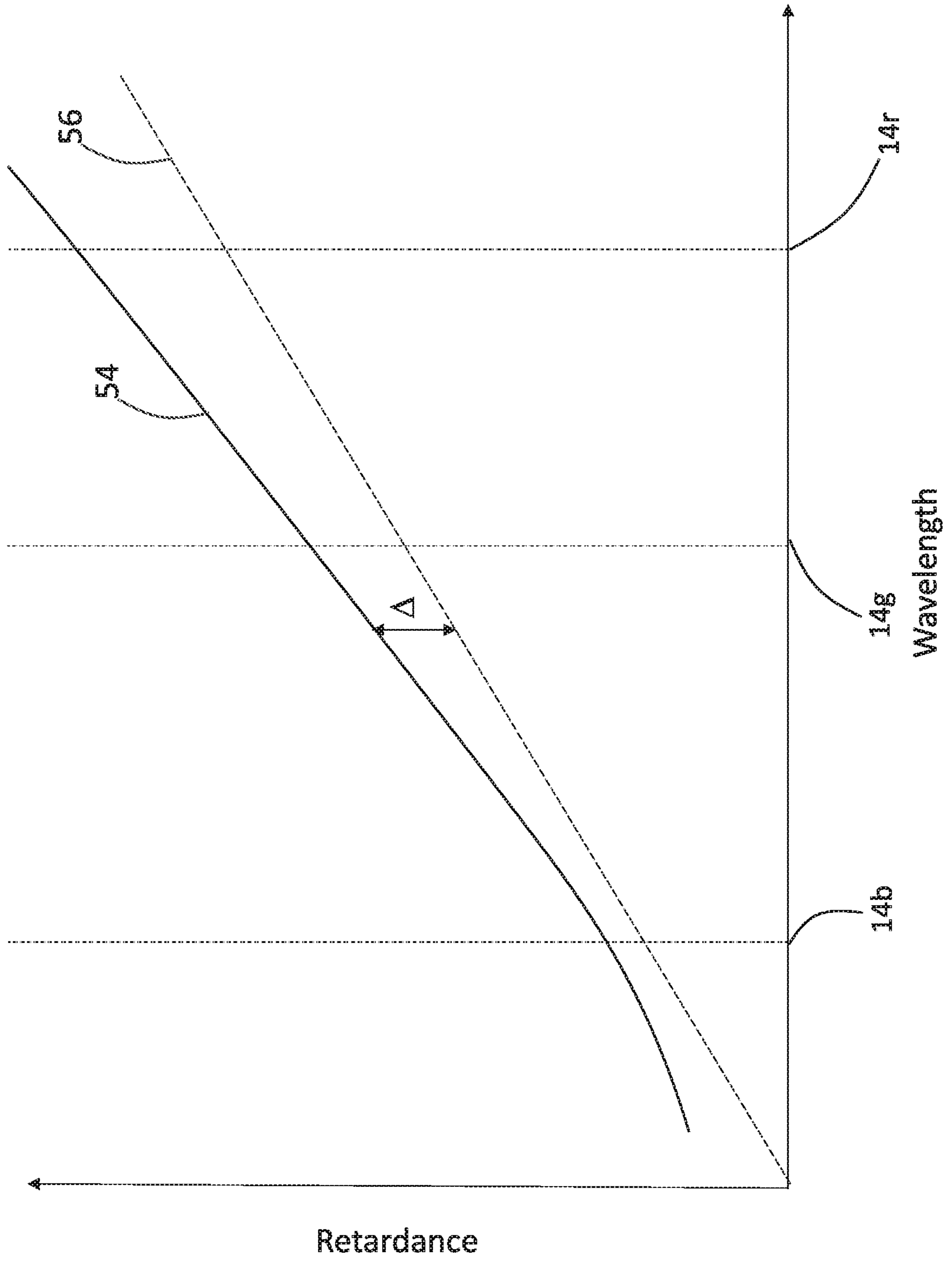
FIG. 12 is a schematic plot of retardance versus wavelength.

FIG. 12 is a schematic plot of retardance versus wavelength illustrating a relationship 56 between wavelength and retardance embodied by an ideal quarter-wave retarder, where wavelength and retardance vary linearly, and illustrating an exemplary relationship 54 between wavelength and retardance for some embodiments of the retarder layer 40. It can also be seen that a wavelength-dependent deviation Δ exists between the retarder layer relationship 54 and the ideal quarter-wave relationship 56. In some embodiments, the retarder layer 40 has a smaller deviation Δ from being a quarter-wave retarder at a blue wavelength (e.g., the blue peak wavelength 14*b*) than at a red wavelength (e.g., the red peak wavelength 14*r*). In some embodiments, the retarder layer 40 has a smaller deviation Δ from being a quarter-wave retarder at a blue wavelength (e.g., the blue peak wavelength 14*b*) than at a green wavelength (e.g., the green peak wavelength 14*g*). It has been found that having a retarder layer 40 with a lower deviation Δ for blue wavelengths than for red wavelengths, for example, can result in a reduced color shift with view angle of ambient light reflected from the display. A retarder layer can be selected to have a smaller deviation Δ from being a quarter-wave retarder at a blue wavelength by suitably selecting the thickness of the retarder layer. Suitable retarder layers, and display systems including the retarder layers, are described further in U.S. Pat. Appl. No. 62/906,852 filed on Sep. 27, 2019 and titled "COLOR NEUTRAL EMISSIVE DISPLAY WITH NOTCHED REFLECTIVE POLARIZER".

In some embodiments, an optical stack 301 includes a reflective polarizer 20, which can be any reflective polarizer described herein, disposed on a retarder layer 40, where the retarder layer 40 has a smaller deviation Δ from being a quarter-wave retarder for a blue wavelength (e.g., 14*b*) than for a red wavelength (e.g., 14*r*). In some such embodiments or in other embodiments, the optical stack 301 further includes an absorbing polarizer 50 disposed on the reflective polarizer 20 opposite the retarder layer 40, such that for substantially normally incident light 30 polarized along the first direction, the absorbing polarizer absorbs at least 60% of the incident light for each of the blue (e.g., 14*b*), green (e.g., 14*g*) and red (e.g., 14*r*) wavelengths, and has transmittances Tb, Tg and Tr for the respective blue, green and red wavelengths, where Tr>Tb and Tg.

Figure 13:
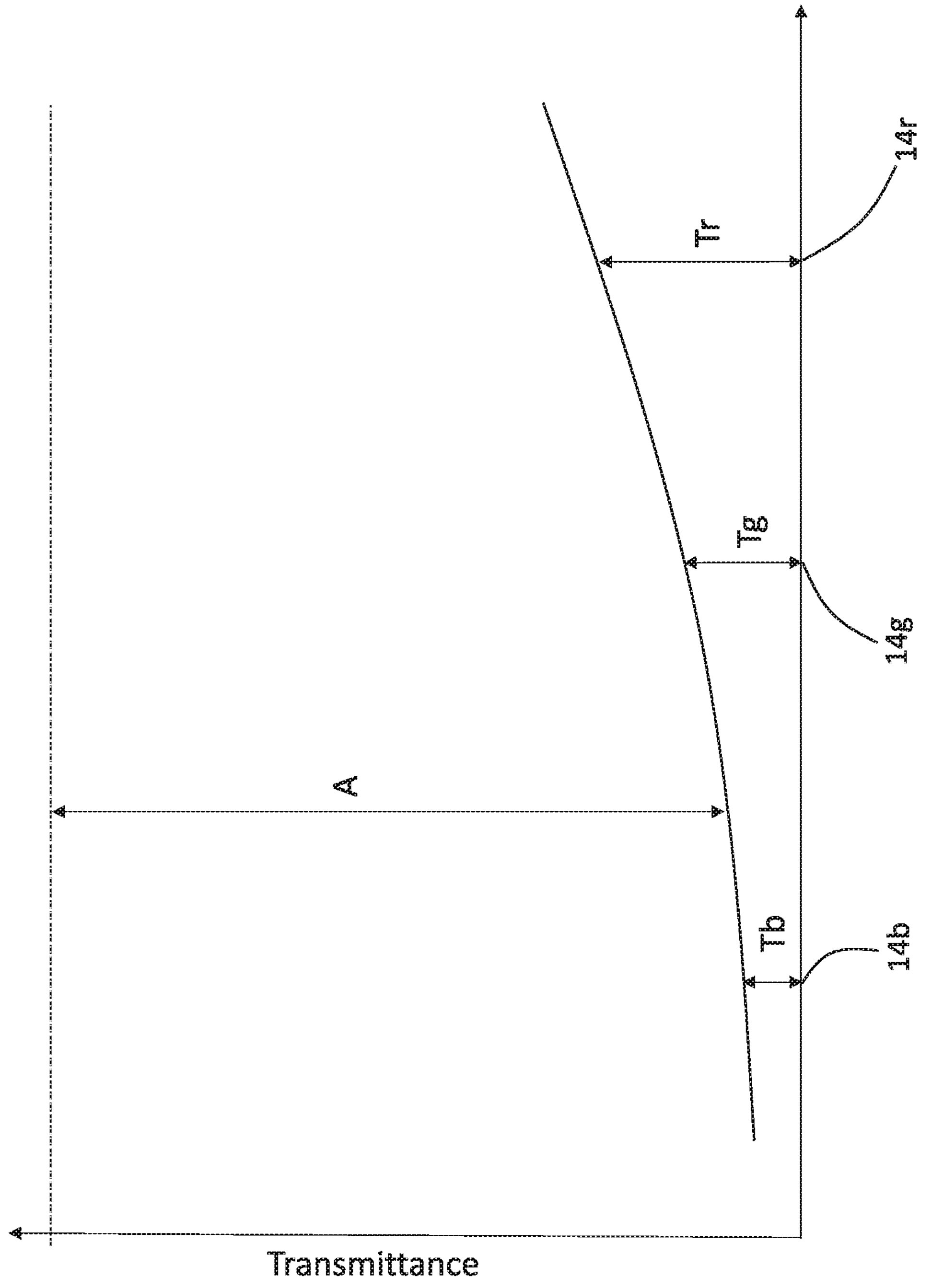
FIG. 13 is a schematic plot of transmittance of an absorbing polarizer versus wavelength.

FIG. 13 is a schematic plot of transmittance of an absorbing polarizer 50 for substantially normally incident light 30 having the first polarization state (e.g., x-axis). In some embodiments, Fresnel reflections are negligible, and the absorbance A of the absorbing polarizer is about 1 (or 100%) minus the transmittance. In some embodiments, the absorbance A is at least 60% or at least 70% throughout the visible range (400 nm to 700 nm) or for each of a blue wavelength (e.g., the blue peak wavelength 14*b*), a green wavelength (e.g., the green peak wavelength 14*g*) and a red wavelength (e.g., the red peak wavelength 14*r*). In some embodiments, the display system 300, or the optical stack 301, includes an absorbing polarizer 50 disposed on the reflective polarizer 20 opposite the retarder layer 40, such that for substantially normally incident light having the first polarization state, the absorbing polarizer 50 absorbs at least 60% or at least 70% of the incident light for each of the blue, green and red wavelengths, and has transmittances Tb, Tg and Tr for the blue, green and red wavelengths. In some embodiments, Tr>Tb and Tg (i.e., Tr>Tb and Tr>Tg). In some embodiments, Tr is less than about 30%, or less than about 20%, or less than about 10%. In some embodiments, Tr−Tg is greater than about 5% (or about 0.05). In some embodiments, Tr−Tb is greater than about 5% (or about 0.05) or greater than about 8% (or about 0.08). In some embodiments, the transmittance for substantially normally incident light having the second polarization state is at least 60%, or at least 70%, or at least 80% for each of the blue, green and red peak wavelengths. The transmission through an absorbing polarizer can be adjusted by suitably selecting the types and concentrations of dichroic dyes, for example, used in the polarizer.

The following are illustrative embodiments of the present disclosure.

A first embodiment is a reflective polarizer comprising a plurality of alternating polymeric layers, such that for substantially normally incident light and for a blue wavelength, a green wavelength, and a red wavelength, the reflective polarizer:

- comprises a transmission spectrum comprising a blue transmission stop band for the incident light polarized along a first direction;
- reflects at least about 50% of the incident light polarized along the first direction for the blue wavelength;
- transmits at least about 50% of the incident light polarized along an orthogonal second direction for each of the blue, green and red wavelengths; and
- transmits between about 50% and about 95% of the incident light polarized along the first direction for each of the green and red wavelengths, wherein the blue transmission stop band comprises a first band edge where the transmittance of the reflective polarizer decreases with increasing wavelength and an opposing second band edge where the transmittance of the reflective polarizer increases with increasing wavelength, the first and second band edges having respective first and second slope magnitudes S1 and S2, S1/S2≥2.

A second embodiment is the reflective polarizer of the first embodiment, wherein S1/S2≥3.

A third embodiment is a reflective polarizer comprising a plurality of alternating polymeric layers, such that for substantially normally incident light and for a blue wavelength, a green wavelength, and a red wavelength, the reflective polarizer:

- reflects at least about 50% of the incident light polarized along a first direction for the blue wavelength;
- transmits at least about 50% of the incident light polarized along an orthogonal second direction for each of the blue, green and red wavelengths; and
- transmits Tb, Tg and Tr % of the incident light polarized along the first direction at the respective blue, green and red wavelengths, wherein Tb is less than each of Tg and Tr by at least 30%, Tg and Tr are within 20% of each other, and wherein a smallest wavelength range over which the transmittance of the reflective polarizer for the incident light polarized along the first direction increases with increasing wavelength by at least about 30% is at least 25 nm wide and disposed between the blue and green wavelengths.

A fourth embodiment is an optical stack comprising the reflective polarizer of any one of the first through third embodiments disposed on a retarder layer, the retarder layer having a smaller deviation from being a quarter-wave retarder for the blue wavelength than for the red wavelength.

A fifth embodiments is the optical stack of the fourth embodiment further comprising an absorbing polarizer disposed on the reflective polarizer opposite the retarder layer, such that for substantially normally incident light polarized along the first direction, the absorbing polarizer absorbs at least 60% of the incident light for each of the blue, green and red wavelengths, and has transmittances Tb, Tg and Tr for the respective blue, green and red wavelengths, Tr>Tb and Tg.

A sixth embodiment is a display system comprising a display panel and the optical stack of the fourth or fifth embodiment disposed on the display panel, the display panel comprising a plurality of at least blue, green and red light emitting pixels having respective blue, green and red emission spectra comprising respective blue, green and red emission peaks at the blue, green, and red wavelengths, respectively.

A seventh embodiment is a reflective polarizer comprising a plurality of alternating polymeric layers, such that for substantially normally incident light, the reflective polarizer comprises:

- a reflectance in a range of 30% to 70% throughout a first wavelength range for a first polarization state, the first wavelength range being at least 20 nm wide and disposed between 400 nm and 500 nm, a difference between maximum and minimum reflectances in the first wavelength range for the first polarization state being less than 15%;
- a reflectance in a range of 15% to 40% throughout a second wavelength range for the first polarization state, the second wavelength range being at least 20 nm wide and disposed between 550 nm and 650 nm, a difference between maximum and minimum reflectances in the second wavelength range for the first polarization state being less than 15%, the maximum reflectance in the second wavelength range for the first polarization state being less than 0.8 times the minimum reflectance in the first wavelength range for the first polarization state; and
- an average transmittance of greater than 75% over a wavelength range extending at least from 450 nm to 650 nm for a second polarization state orthogonal to the first polarization state.

An eighth embodiment is the reflective polarizer of the seventh embodiment, wherein at least one of the first and second wavelength ranges is at least 30 nm wide, the difference between the maximum and minimum reflectances in the first wavelength range for the first polarization state is less than 12%, the difference between the maximum and minimum reflectances in the second wavelength range for the first polarization state is less than 12%, and the maximum reflectance in the second wavelength range for the first polarization state is less than 0.7 times the minimum reflectance in the first wavelength range for the first polarization state A ninth embodiment is a display system including a display panel and the reflective polarizer of the seventh or eighth embodiments disposed on the display panel to receive light emitted by the display panel, the display panel comprising a plurality of at least blue, green and red light emitting pixels having respective blue, green and red emission spectra comprising respective blue, green and red emission peaks at respectively blue, green, and red peak wavelengths, the blue peak wavelength being in the first wavelength range, the second wavelength range being disposed between the green and red peak wavelengths.

A tenth embodiment is a display system comprising a display panel and the reflective polarizer of the first or second embodiment disposed on the display panel, the display panel comprising a plurality of at least blue, green and red light emitting pixels having respective blue, green and red emission spectra comprising respective blue, green and red emission peaks at the blue, green, and red wavelengths, respectively. Alternatively, a tenth embodiment is a display system comprising:

a display panel comprising a plurality of at least blue, green and red light emitting pixels having respective blue, green and red emission spectra comprising respective blue, green and red emission peaks at respective blue, green and red peak wavelengths; and a reflective polarizer disposed on the plurality of the at least blue, green and red light emitting pixels, such that for substantially normally incident light, the reflective polarizer:

comprises a transmission spectrum comprising a substantially distinct blue transmission stop band for the incident light polarized along a first direction;

reflects at least about 50% of the incident light polarized along the first direction for the blue peak wavelength;

transmits at least about 50% of the incident light polarized along an orthogonal second direction for each of the blue, green and red peak wavelengths; and transmits between about 50% and about 95% of the incident light polarized along the first direction for each of the green and red peak wavelengths, wherein the substantially distinct blue transmission stop band comprises a first band edge where the transmittance of the reflective polarizer decreases with increasing wavelength and an opposing second band edge where the transmittance of the reflective polarizer increases with increasing wavelength, the first and second band edges having respective first and second slope magnitudes S1 and S2, $S1/S2 \geq 2$.

An eleventh embodiment is a display system comprising a display panel and the reflective polarizer of the third embodiment disposed on the display panel, the display panel comprising a plurality of at least blue, green and red light emitting pixels having respective blue, green and red emission spectra comprising respective blue, green and red emission peaks at the blue, green, and red wavelengths, respectively. Alternatively, an eleventh embodiment is a display system comprising:

a display panel comprising a plurality of at least blue, green and red light emitting pixels having respective blue, green and red emission spectra comprising respective blue, green and red emission peaks at respective blue, green and red peak wavelengths; and a reflective polarizer disposed on the plurality of the at least blue, green and red light emitting pixels, such that for substantially normally incident light, the reflective polarizer:

reflects at least about 50% of the incident light polarized along the first direction for the blue peak wavelength;

transmits at least about 50% of the incident light polarized along an orthogonal second direction for each of the blue, green and red peak wavelengths; and transmits Tb, Tg and Tr % of the incident light polarized along the first direction at the respective blue, green and red peak wavelengths, wherein Tb is less than each of Tg and Tr by at least 30%, Tg and Tr are within 20% of each other, and wherein a smallest wavelength range over which the transmittance of the reflective polarizer for the incident light polarized along the first direction increases with increasing wavelength by at least about 30% is at least 25 nm wide and is disposed between the blue and green peak wavelengths.

A twelfth embodiment is a display system comprising:

a display panel comprising a plurality of at least blue, green and red light emitting pixels having respective blue, green and red emission spectra comprising respective blue, green and red emission peaks at respective blue, green and red peak wavelengths with respective blue, green and red full width at half maxima (FWHMs); and a reflective polarizer disposed on the plurality of pixels, such that for substantially normally incident light, the reflective polarizer:

comprises a reflection spectrum for the incident light polarized along a first direction, the reflection spectrum comprising a local blue reflection band comprising corresponding local blue maximum and local full width at half the local blue maximum (FWHM), the local FWHM of the reflective polarizer at least partially overlapping the FWHM of the blue emission spectrum;

reflects at least about 50% of the incident light polarized along the first direction at the blue peak wavelength;

transmits at least about 50% of the incident light polarized along an orthogonal second direction at each of the blue, green and red peak wavelengths; and comprises a transmission spectrum for the incident light polarized along the first direction that comprises sequentially arranged first, second and third spectrum portions, the second spectrum portion joining the first and the third spectrum portions, such that for each spectrum portion:

the spectrum portion is disposed between the blue and red peak wavelengths and has a width W, $W \geq 10$ nm; and the transmission spectrum increases by $\Delta T$ across the width W of the spectrum portion, wherein $\Delta T/W$ for the second spectrum portion is less than $\Delta T/W$ for each of the first and third spectrum portions.

A thirteenth embodiment is a display system comprising:

a display panel comprising a plurality of at least blue, green and red light emitting pixels having respective blue, green and red emission spectra comprising respective blue, green and red emission peaks at respective blue, green and red peak wavelengths with respective blue, green and red full width at half maxima (FWHMs); and a reflective polarizer disposed on the plurality of pixels, such that for substantially normally incident light, the reflective polarizer:

comprises a reflection spectrum for the incident light polarized along a first direction, the reflection spectrum comprising a local blue reflection band comprising corresponding local blue maximum and local full width at half the local blue maximum (FWHM), the local FWHM of the reflective polarizer at least partially overlapping the FWHM of the blue emission spectrum;

reflects at least about 50% of the incident light polarized along the first direction at the blue peak wavelength;

transmits at least about 50% of the incident light polarized along an orthogonal second direction at each of the blue, green and red peak wavelengths; and comprises a transmission spectrum for the incident light polarized along the first direction that comprises spaced apart local first and second transmission stop bands disposed between the blue and red peak wavelengths, each stop band being at least 7 nm wide.

A fourteenth embodiment is a display system having a light emission surface and comprising:

a display panel comprising a plurality of at least blue light emitting pixels; and a reflective polarizer disposed on the display panel, the reflective polarizer having a transmission spectrum comprising a blue transmission stop band for substantially normally incident light polarized along a first direction such that the reflective polarizer increases a brightness of blue light emitted through the light emission surface by at least about 10 percent, wherein for a CIE Standard Illuminant D65 light substantially normally incident on the light emission surface, the display system reflects less than 8 percent of the incident light as a reflected light, the reflected light having CIELAB color space coordinates a*, b*, such that $|a^*|<3$ and $|b^*|<6$.

A fifteenth embodiment is the display system of the fourteenth embodiment, wherein the display panel further comprises a plurality of at least green and red light emitting pixels, and wherein the reflective polarizer increases a brightness of substantially white light emitted through the light emission surface by at least about 10 percent.

The reflective polarizer included in the display system of the fourteenth or fifteenth embodiments can be the reflective polarizer of any one of the first through third embodiments or the seventh through ninth embodiments. An optical stack of the fourth or fifth embodiments can be disposed on the display panel and include the reflective polarizer of the display system of the fourteenth or fifteenth embodiments.

EXAMPLES

Example 1

A computational model was used to calculate reflection and transmission properties of a reflective polarizer. The computational model was driven by a 4×4 matrix solver routine based on the Berriman algorithm where the reflection and transmission matrix elements can be computed for an arbitrary stack of 1-dimensional layers, with each layer defined by its physical thickness and the by a dispersive refractive index tensor where each principal element of the refractive index tensor is a function of wavelength (λ).

A multilayer optical film reflective polarizer was modeled that included optical repeat units (ORUs) which were modeled as being composed of high index layers of polyethylene terephthalate (PET) and low index layers of a copolyester of polyethylene terephthalate with cyclohexane dimethanol used as a glycol modifier (PETG, such as available from Eastman Chemicals, Knoxville, Tenn.).

Figure 14:
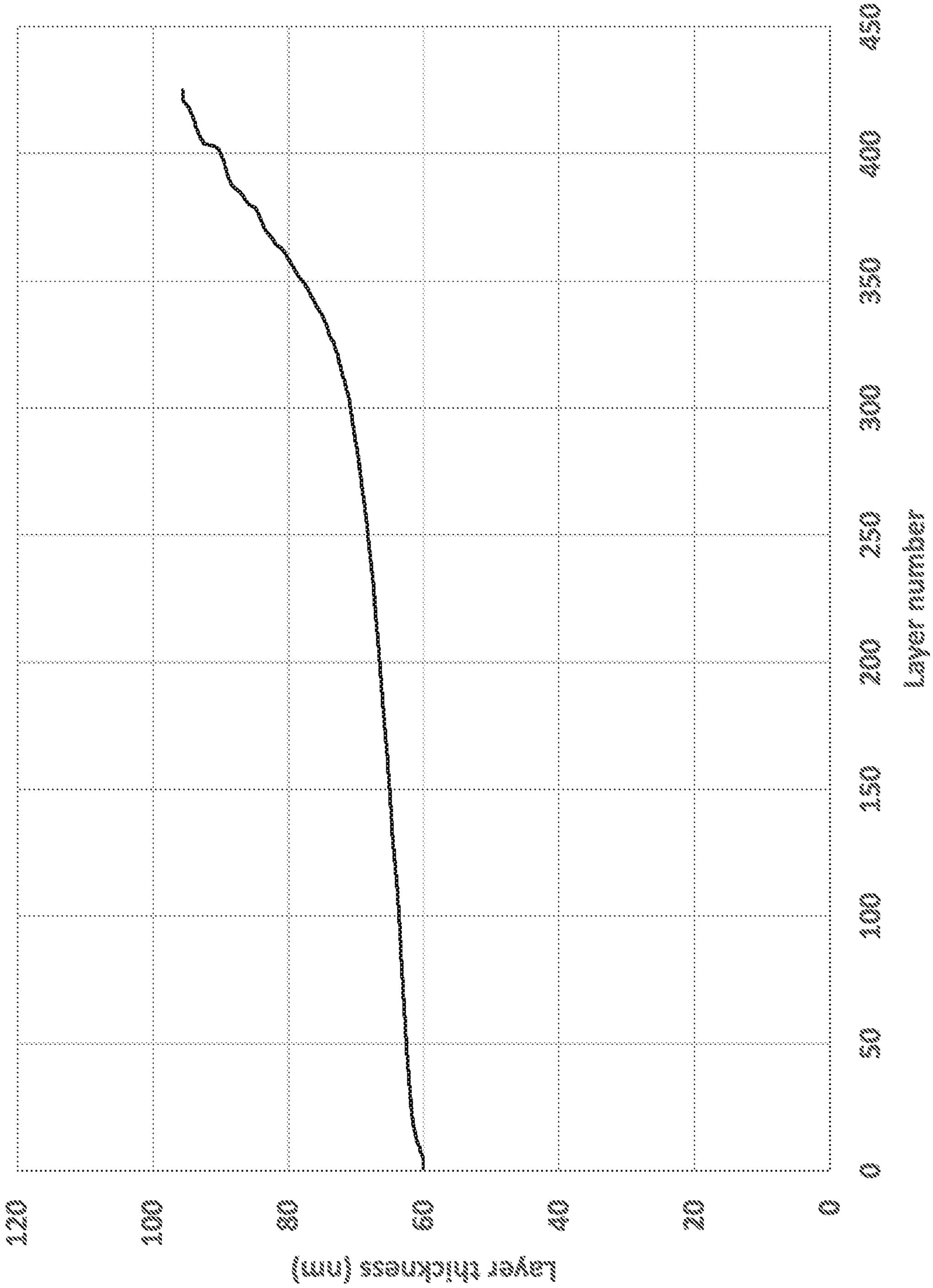
FIGS. 14-15 are plots of layer thickness profiles for reflective polarizers.

A thickness profile of the microlayers was mathematically generated. The physical thickness profile is shown in FIG. 14. The thickness profile was bounded on both sides by a protective boundary layer of the low index material with a thickness of 2000 nm.

Representative values of the refractive index for the high index optical (HIO) layers (PET), denoted Nx, Ny, Nz along the x, y, z axes, respectively, and for the low index optical (LIO) layers (PETg) are shown in the following table:

| | HIO | | | LIO | | |
|---|---|---|---|---|---|---|
| λ | Nx | Ny | Nz | Nx | Ny | Nz |
| 450 nm | 1.7322 | 1.6110 | 1.5380 | 1.6707 | 1.6025 | 1.5892 |
| 530 nm | 1.7048 | 1.5881 | 1.5256 | 1.6485 | 1.5812 | 1.5681 |
| 630 nm | 1.6912 | 1.5764 | 1.5191 | 1.6388 | 1.5718 | 1.5588 |

The reflectance and transmittance for normally incident light polarized along orthogonal p- and s-directions were calculated and is shown in FIG. 5.

Examples 2-4

Figure 15:
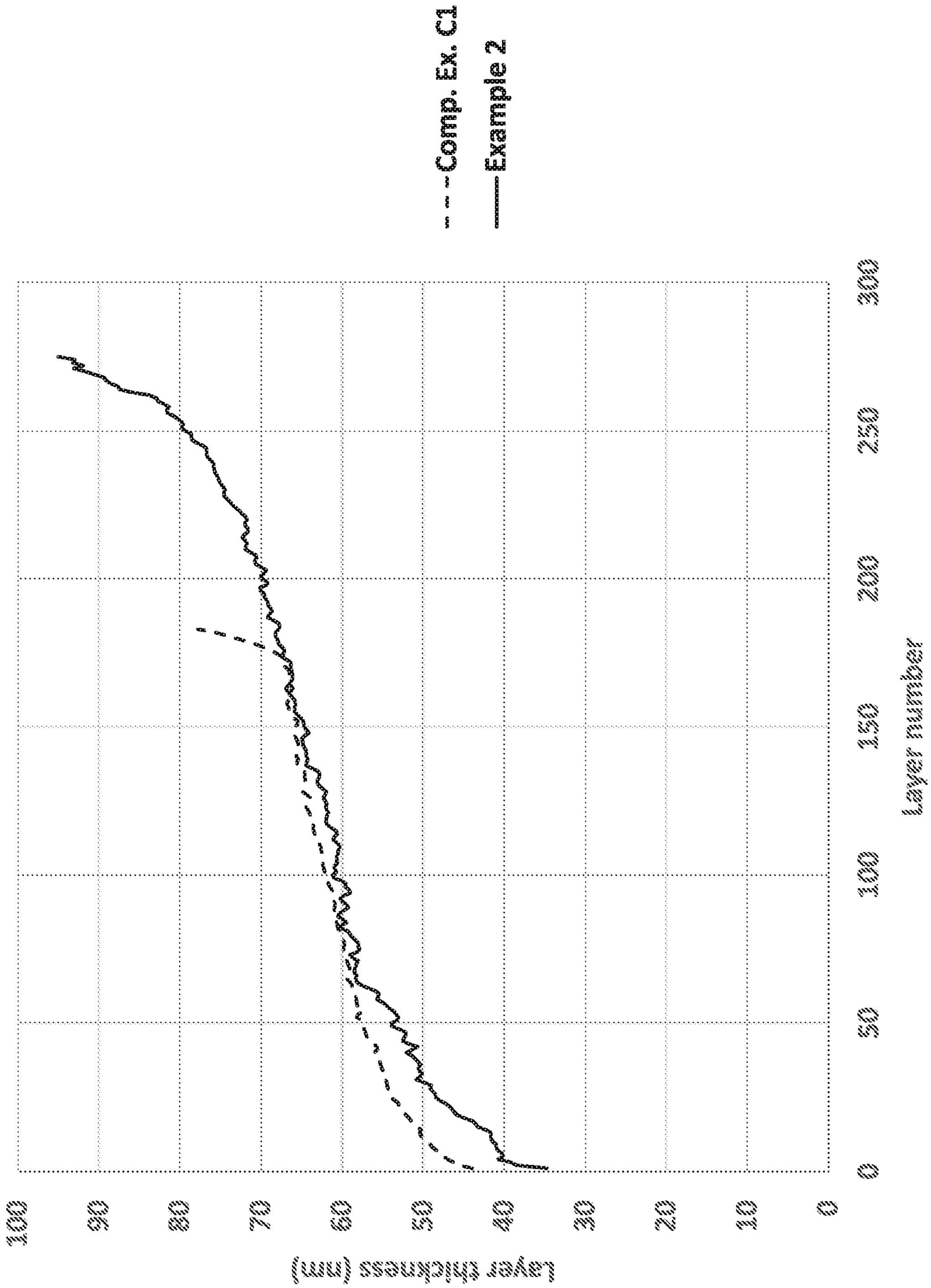

Reflective polarizer films were prepared as follows: A multilayer optical packet of 275 layers was co-extruded. The packet contained alternating layers of polyethylene terephthalate (PET), and a low index layer, which was made with either PETG (glycol-modified PET) or a 33:33:33 blend of PETG, PCTG (glycol-modified polycyclohexylendimethylene terephthalate), and an "80:20" copolyester having 40 mol % terephthalic acid, 10 mol % isophthalic acid, 49.75 mol % ethylene glycol, and 0.25 mol % trimethyl propanol. The PET and PETG or co-PET blend polymers were fed from separate extruders at a target f-ratio (ratio of optical thickness of high index layer to optical thickness of optical repeat unit) as indicated in the table below to a multilayer coextrusion feedblock, in which they were assembled into packet(s) of alternating optical layers, plus a thicker protective boundary layer of the PET, on each side. The multilayer melt was then cast through a film die onto a chill roll, in the conventional manner for polyester films, upon which it was quenched. The cast web was then stretched in a linear tenter in the crossweb direction at a draw ratio of about 6:1. The stretch temperature was 225° F. and an anneal oven was used to heat set the film at 375° F. The layer thickness profile for Example 2 is shown in FIG. 15. The layer thickness profiles for Examples 3 and 4 were similar to the layer thickness profile for Example 2. The layer thickness profiles were selected to produce the transmission spectra shown in FIG. 16. Average slope magnitudes S1 and S2 for left and right band edges were determined over wavelength ranges where the transmission changed by about 30 percent and the results are provided in the table below.

| Example | S1/S2 | Thickness (μm) | Number layers | Materials | f-ratio | Heat set temp (° F.) |
|---|---|---|---|---|---|---|
| 1 | −4.60 | 33.8 | 425 | PET and PETg | 0.5 | |
| 2 | −3.31 | 47.7 | 275 | PET and blend | 0.529 | 375 |
| 3 | −2.69 | 48.9 | 275 | PET and PETg | 0.529 | 450 |
| 4 | −3.10 | 47.2 | 275 | PET and PETg | 0.529 | 450 |

Comparative Examples C1-C2

Reflective polarizer films were prepared as follows: a multilayer optical packet of 186 layers was co-extruded. The packet contained alternating layers of 90/10 coPEN, a polymer composed of 90% polyethylene naphthalate (PEN) and 10% polyethylene terephthalate (PET), and a low index isotropic layer, which was made with a blend of polycarbonate and copolyesters (PC:coPET) such that the index was about 1.57 and such that the isotropic layer remained substantially isotropic upon uniaxial orientation of the film. The PC:coPET molar ratio was approximately 42.5 mol % PC and 57.5 mol % coPET and had a Tg of 105 degrees centigrade. This isotropic material was chosen such that after stretching its refractive indices in the two non-stretch directions remained substantially matched with those of the birefringent material in the non-stretching direction while in the stretching direction there was a substantial mis-match in refractive indices between birefringent and non-birefringent layers. The 90/10 PEN and PC:coPET polymers were fed from separate extruders at a target f-ratio of 0.5 to a multilayer coextrusion feedblock, in which they were assembled into packet(s) of alternating optical layers, plus a thicker protective boundary layer of the PC:coPET, on each side. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006. The layer thickness profile for Comparative Example C1 is shown in FIG. 15. The layer thickness profiles for Comparative Example C2 was similar. Comparative Example C1 had a thickness of 10.5 micrometers and Comparative Example C2 had a thickness of 11 micrometers.

Figure 16:
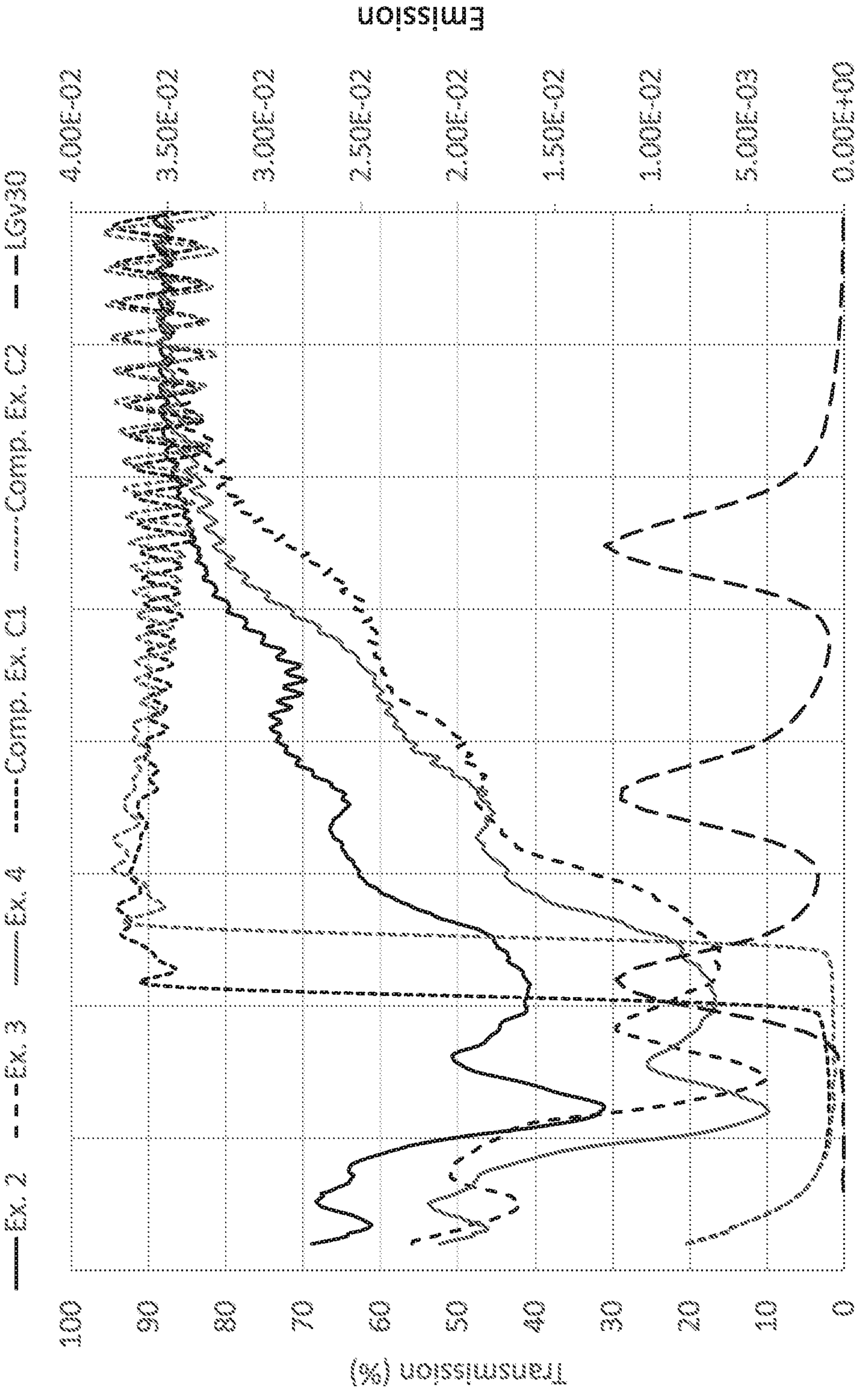
FIG. 16 is a plot showing transmission spectra for reflective polarizers.

The transmission for substantially normally incident light polarized along the p-direction (block polarization state) was measured and is shown in FIG. 16 for Example 2-4 and Comparative Examples C1-C2. The emission spectrum for a display panel from an LGv30 phone is also shown in the figure.

Figure 17:
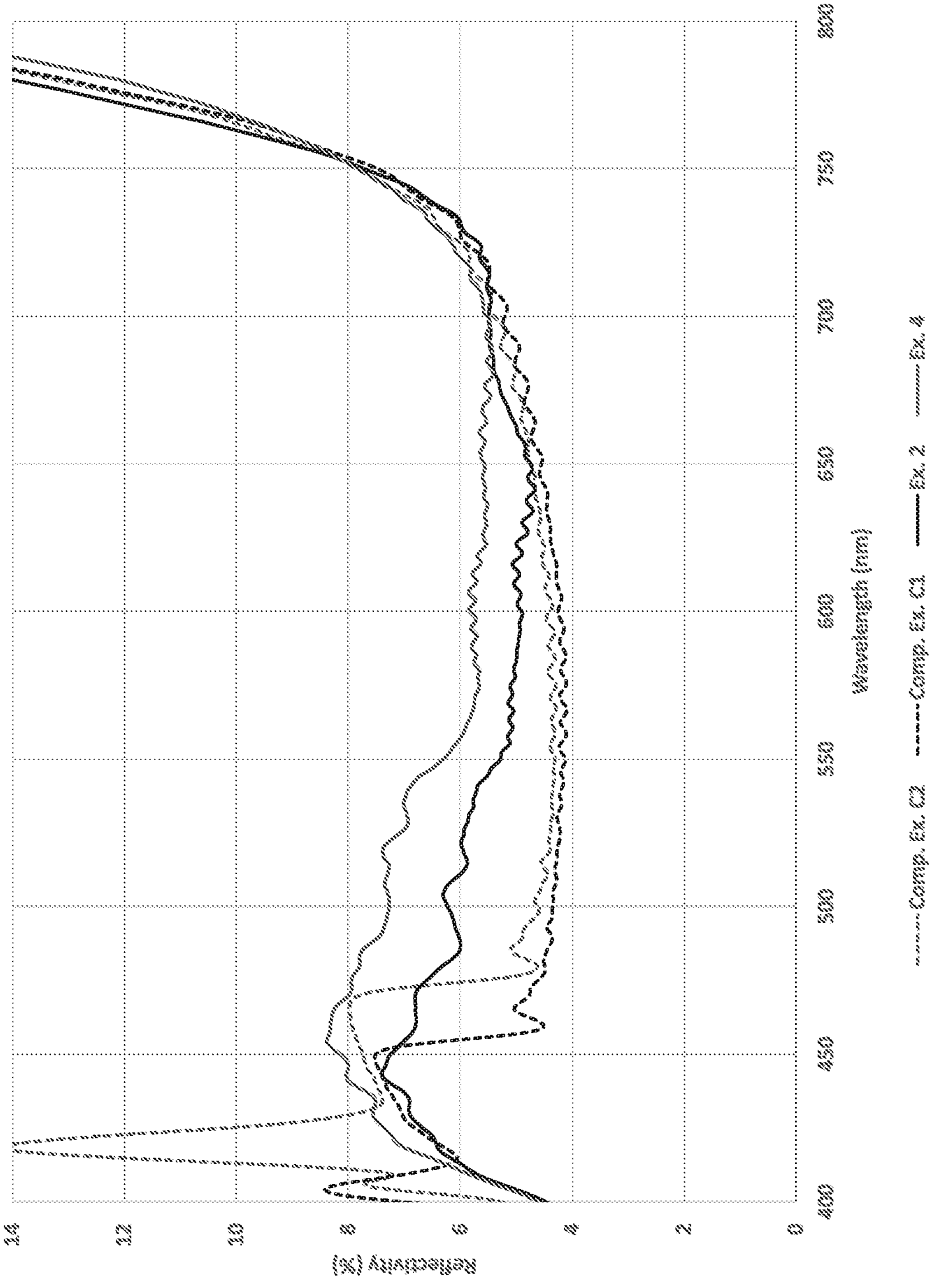
FIG. 17 is a plot of ambient reflectivity versus wavelength for display systems.

Various reflective polarizer samples were incorporated together with an absorbing polarizer on one surface and a quarter-wave plate on the other to form a circular polarizer. An absorbing polarizer 5618 H-type from Sanritz (Toyama, Japan) was laminated to the example films where the block axes were substantially aligned. On the opposite side of the films, a quarter wave plate (QWP) with trade name APQW92-004-PC-140NMHE from American Polarizers, Inc. (Reading, PA) was laminated with 8171 optically clear adhesive from 3M Company (St. Paul, MN). The QWP optical axis was approximately 45 degrees relative to the optic axis of the polarizers. The resulting circular polarizer was then laminated to a LG OLED TV model 55B8PUA, where the original circular polarizer had been removed from the display. Reflectivity was measured via a Lambda 900 Spectrometer from Perkin Elmer and is shown in FIG. 17. The CIELAB a* and b* parameters for reflected light were determined for CIE Standard Illuminant D65 incident light. The luminance gain (brightness with the reflective polarizer divided by brightness without the reflective polarizer times 100%) for white light output and for blue pixel only light output was determined via a PR-740 Spectrophotometer from Photo Research Inc. (Chatsworth, CA). Results are summarized in the following table:

| | White luminance gain | Blue luminance gain | Average photopic reflectivity (%) | Reflected CIELAB a* | Reflected CIELAB b* |
|---|---|---|---|---|---|
| Comp. Ex. C1 | 105% | 118% | 4.27 | 4.88 | −8.18 |
| Comp. Ex. C2 | 106% | 127% | 4.51 | 7.37 | −13.04 |
| Example 2 | 114% | 119% | 5.07 | −0.54 | −3.29 |
| Example 4 | 126% | 130% | 5.26 | −1.69 | −3.18 |

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 5 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.95 and 1.05, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A reflective polarizer comprising a plurality of alternating polymeric layers, such that for substantially normally incident light and for a blue wavelength, a green wavelength, and a red wavelength, the reflective polarizer:

comprises a transmission spectrum comprising a blue transmission stop band for the incident light polarized along a first direction;

reflects at least about 50% of the incident light polarized along the first direction for the blue wavelength;

transmits at least about 50% of the incident light polarized along an orthogonal second direction for each of the blue, green and red wavelengths; and transmits between about 50% and about 95% of the incident light polarized along the first direction for each of the green and red wavelengths, wherein the blue transmission stop band comprises a first band edge where the transmittance of the reflective polarizer decreases with increasing wavelength and an opposing second band edge where the transmittance of the reflective polarizer increases with increasing wavelength, the first and second band edges having respective first and second slope magnitudes S1 and S2, S1/S2≥2, wherein the transmittance percent value varies by 30 percentage points along the first and second band edges over respective first and second wavelength ranges, the first and second slope magnitudes S1 and S2 being 30% divided by magnitudes of the respective first and second wavelength ranges, each of the first and second band edges being disposed within a blue wavelength range.

2. The reflective polarizer of claim 1, wherein S1/S2≥3.

3. An optical stack comprising the reflective polarizer of claim 1 disposed on a retarder layer, the retarder layer having a smaller deviation from being a quarter-wave retarder for the blue wavelength than for the red wavelength.

4. The optical stack of claim 3 further comprising an absorbing polarizer disposed on the reflective polarizer opposite the retarder layer, such that for substantially normally incident light polarized along the first direction, the absorbing polarizer absorbs at least 60% of the incident light for each of the blue, green and red wavelengths, and has transmittances Tb, Tg and Tr for the respective blue, green and red wavelengths, Tr>Tb and Tg.

5. A display system comprising a display panel and the optical stack of claim 3 disposed on the display panel, the display panel comprising a plurality of at least blue, green and red light emitting pixels having respective blue, green and red emission spectra comprising respective blue, green and red emission peaks at the blue, green, and red wavelengths, respectively.

6. A display system having a light emission surface and comprising:

a display panel comprising a plurality of at least blue light emitting pixels; and the reflective polarizer of claim 1 disposed on the display panel, such that the reflective polarizer increases a brightness of a blue light emitted through the light emission surface by at least about 10 percent, wherein for a CIE Standard Illuminant D65 light substantially normally incident on the light emission surface, the display system reflects less than 8 percent of the incident light as a reflected light, the reflected light having CIELAB color space coordinates a*, b*, such that |a*|<3 and |b*|<6.

7. The display system of claim 6, wherein the display panel further comprises a plurality of at least green and red light emitting pixels, and wherein the reflective polarizer increases a brightness of substantially white light emitted through the light emission surface by at least about 10 percent.

* * * * *